US011070300B2

(12) United States Patent
Cooper et al.

(10) Patent No.: US 11,070,300 B2
(45) Date of Patent: Jul. 20, 2021

(54) TEST PROBES FOR PHASED ANTENNA ARRAYS

(71) Applicant: Apple Inc., Cupertino, CA (US)

(72) Inventors: Aaron J. Cooper, San Jose, CA (US); Amin Tayebi, San Jose, CA (US); Breanna E. Bredesen, San Jose, CA (US); Carlo Di Nallo, Belmont, CA (US); Michael J. Williams, Cupertino, CA (US); Nikolaj P. Kammersgaard, Copenhagen (DK); Qian Zhang, La Jolla, CA (US); Tyler R. Roschuk, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 176 days.

(21) Appl. No.: 16/357,184

(22) Filed: Mar. 18, 2019

(65) Prior Publication Data
US 2020/0304216 A1 Sep. 24, 2020

(51) Int. Cl.
H04B 17/10 (2015.01)
G01R 29/10 (2006.01)
H01Q 21/06 (2006.01)
H04B 17/16 (2015.01)

(52) U.S. Cl.
CPC .......... H04B 17/102 (2015.01); G01R 29/10 (2013.01); H01Q 21/062 (2013.01); H04B 17/16 (2015.01)

(58) Field of Classification Search
CPC .... H04B 17/102; H04B 17/16; H04B 10/502; H04B 17/12; H04B 17/17; H04B 17/21; H04B 17/391; H04B 7/0413; G01R 29/10; G01R 31/2822; G01R 29/0878; G01R 29/105; G01R 31/308; G01R 29/0857;
(Continued)

(56) References Cited

U.S. PATENT DOCUMENTS 3,783,448 A * 1/1974 Brodwin ............ G01R 29/0878
342/351
4,008,477 A * 2/1977 Babij ....................... H01Q 9/16
343/701
4,360,741 A 11/1982 Fitzsimmons et al.
(Continued)

FOREIGN PATENT DOCUMENTS

GB 2428093 A 1/2007

Primary Examiner — Renan Luque
(74) Attorney, Agent, or Firm — Treyz Law Group, P.C.; Michael H. Lyons; Tianyi He

(57) ABSTRACT

An electronic device may be provided with wireless circuitry that is tested in a test system. The test system may include test probes. Circuitry under test may wirelessly transmit test signals. The test probes may receive the test signals at multiple locations. Circuitry may measure direct current (DC) voltages generated by the test probes and may convert the voltages to electric field magnitudes. A test host may process the electric field magnitudes to determine whether the circuitry under test exhibits a satisfactory radiation pattern. The test probes may include dielectric substrates and one or more dipole elements coupled to respective diodes. The dipole elements may include indium tin oxide (ITO) and may include first and second sets of orthogonal dipole elements. Transmission lines coupled to the dipole elements may include ITO and may form low pass filters that convert rectified voltages produced by the diodes into the DC voltages.

18 Claims, 19 Drawing Sheets

(58) Field of Classification Search
CPC ... G01R 29/0885; H01Q 21/062; H01Q 3/267
See application file for complete search history.

(56) References Cited

U.S. PATENT DOCUMENTS

| | | | | |
|---|---|---|---|---|
| 4,752,730 | A * | 6/1988 | Aslan | G01R 29/0878 |
| | | | | 324/119 |
| 5,122,809 | A * | 6/1992 | Haruyama | H01Q 9/285 |
| | | | | 333/247 |
| 5,619,061 | A | 4/1997 | Goldsmith et al. | |
| 6,118,426 | A | 9/2000 | Albert et al. | |
| 6,130,607 | A | 10/2000 | McClanahan et al. | |
| 6,664,562 | B2 | 12/2003 | Weiss et al. | |
| 9,372,114 | B2 | 6/2016 | Carr | |
| 9,582,981 | B2 | 2/2017 | Rokhsaz et al. | |
| 10,056,691 | B2 | 8/2018 | Soler Castany et al. | |
| 2006/0187135 | A1 * | 8/2006 | Maniwa | H01Q 1/2225 |
| | | | | 343/795 |
| 2006/0273976 | A1 * | 12/2006 | Wang | H01Q 9/285 |
| | | | | 343/795 |
| 2011/0207412 | A1 * | 8/2011 | De Flaviis | H04B 17/318 |
| | | | | 455/67.11 |
| 2014/0113828 | A1 | 4/2014 | Gilbert et al. | |
| 2016/0329974 | A1 * | 11/2016 | Oneil | H04B 17/19 |
| 2018/0323498 | A1 * | 11/2018 | Bean | H02J 50/20 |
| 2018/0358845 | A1 * | 12/2018 | Criswell | H01Q 15/0066 |
| 2020/0021370 | A1 * | 1/2020 | Huynh | H01Q 3/267 |
| 2020/0067352 | A1 * | 2/2020 | Kothari | H02J 50/27 |
| 2020/0191848 | A1 * | 6/2020 | Grossmann | G01R 29/10 |
| 2020/0292605 | A1 * | 9/2020 | Heuel | G01R 29/0857 |

* cited by examiner

TEST PROBES FOR PHASED ANTENNA ARRAYS

BACKGROUND

This relates generally to electronic devices and, more particularly, to electronic devices with wireless circuitry.

Electronic devices often include wireless circuitry. For example, cellular telephones, computers, and other devices often contain antennas and wireless transceivers for supporting wireless communications.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies may support high bandwidths but may raise significant challenges. For example, radio-frequency communications in millimeter and centimeter wave communications bands can be characterized by substantial attenuation and/or distortion during signal propagation through various mediums.

Wireless test equipment is often used to ensure that wireless circuitry for handling millimeter and centimeter wave communications is operating properly. If care is not taken, wireless test equipment for testing wireless circuitry of this type can be unreliable and prohibitively expensive to assemble and operate.

It would therefore be desirable to be able to provide improved wireless test equipment for testing wireless circuitry that handles millimeter and centimeter wave communications.

SUMMARY

An electronic device may be provided with wireless circuitry. The wireless circuitry may include a phased antenna array that conveys radio-frequency signals in one or more frequency bands between 10 GHz and 300 GHz. The radio-frequency performance of the phased antenna array and other portions of the wireless circuitry may be tested in a wireless test system. The wireless test system may include test equipment such as a test fixture, test measurement circuitry, and one or more test probes. The test measurement circuitry may include an analog-to-digital converter, a voltmeter, and/or other circuitry. A test host may be coupled to the test equipment. The test system may perform radio-frequency test operations on circuitry under test while the circuitry under test is received by the test fixture. The circuitry under test may include some or all of the phased antenna array and/or other portions of the wireless circuitry for the electronic device.

During the radio-frequency test operations, the test host may control the circuitry under test to transmit radio-frequency test signals (e.g., at a frequency greater than 10 GHz). The test probes may receive the radio-frequency test signals at multiple locations across the field of view of the phased antenna array in the circuitry under test. The test measurement circuitry may measure voltages generated by the test probes and may convert the measured voltages to electric field magnitude values. The test probes may receive the radio-frequency test signals at multiple distances from the circuitry under test to determine phases of the radio-frequency test signals. The test host may process the electric field magnitude values and/or the phases of the radio-frequency test signals to determine whether the phased antenna array in the circuitry under test exhibits a satisfactory radiation pattern (e.g., a sufficiently uniform radiation pattern envelope).

The test probe may include a dielectric substrate such as a glass substrate and one or more dipole elements on the dielectric substrate. The dipole elements may be formed from indium tin oxide or other conductive traces patterned on the dielectric substrate. The dipole elements may each have first and second dipole arms and a respective diode coupled between the first and second dipole arms. Contact pads may be formed on the dielectric substrate. Transmission lines may couple the dipole elements to respective pairs of the contact pads. The radio-frequency test signals may produce radio-frequency currents on the dipole arms and the diodes may generate rectified voltages from the radio-frequency currents. The transmission lines may serve as low pass filters that block radio-frequency signals from passing to the contact pads and that convert the rectified voltages into direct current (DC) voltages (e.g., in scenarios where the transmission lines are formed using indium tin oxide). The test measurement circuitry may sense the DC voltages across the contact pads.

In one suitable arrangement, the test probe may be a planar test probe having an M-by-N array of dipole elements on a lateral surface of the dielectric substrate. The array may include a first set of dipole elements and a second set of dipole elements oriented perpendicular to the dipole elements in the first set. In another suitable arrangement, the test probe may be a vertical test probe having a dipole element located at a bottom edge of the dielectric substrate. If desired, the vertical test probe may include orthogonal dipole elements located on orthogonal surfaces of the dielectric substrate. Use of orthogonal dipole elements in the test probe may allow the test probe to generate DC voltages from orthogonal electric field components of the radio-frequency test signals. The test host may interpolate electric field magnitude values for each electric field component at the location of each dipole element in the test probe. The test probe may be relatively inexpensive to assemble and operate and may perform reliable radio-frequency testing on the circuitry under test.

DETAILED DESCRIPTION

Figure 1:
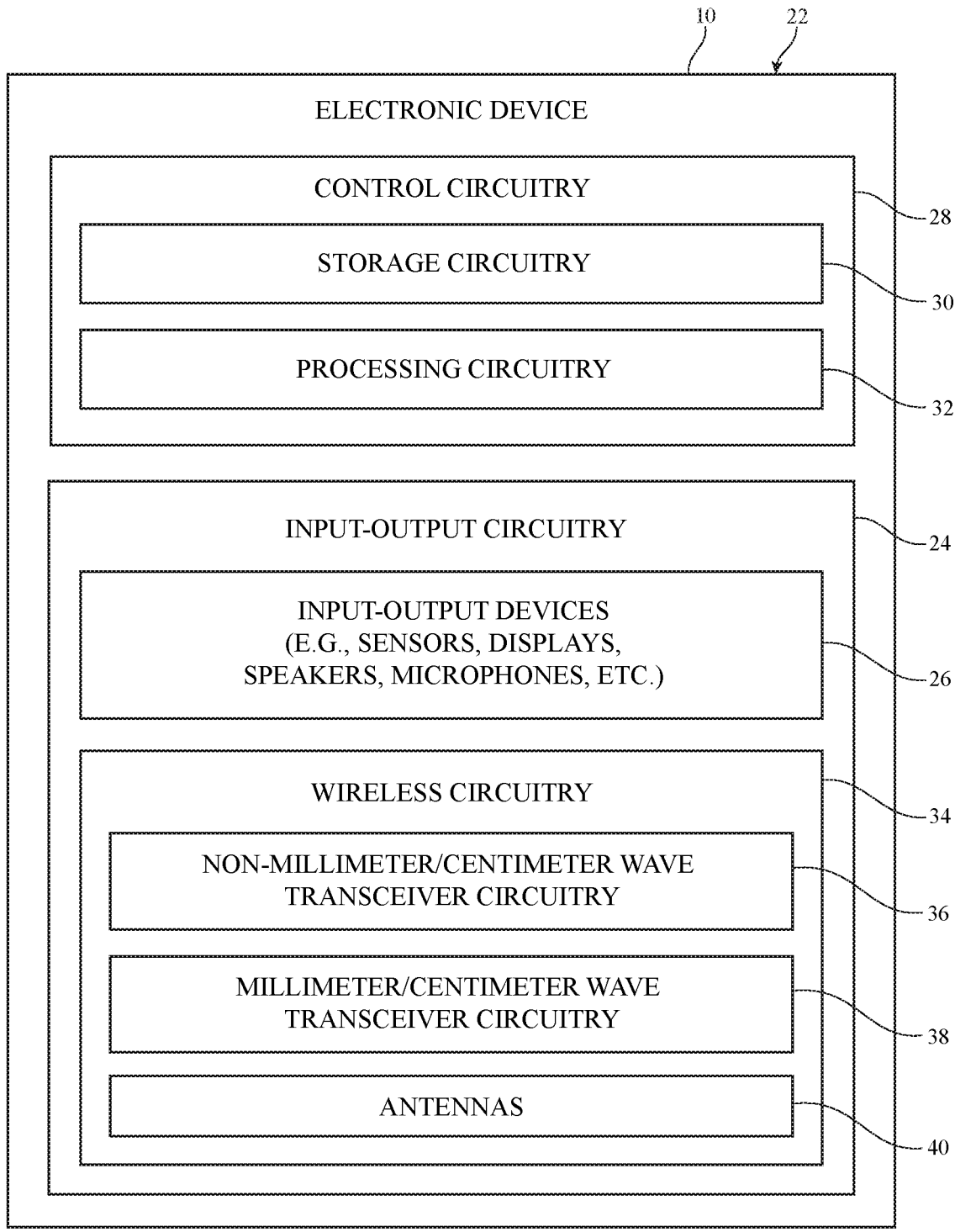
FIG. 1 is a schematic diagram of illustrative circuitry in an electronic device in accordance with some embodiments.

A schematic diagram showing illustrative components that may be used in an electronic device such as electronic device 10 is shown in FIG. 1. Electronic devices such as electronic device 10 may contain wireless circuitry. The wireless circuitry may include one or more antennas. The antennas may include phased antenna arrays that are used for performing wireless communications using millimeter and centimeter wave signals. Millimeter wave signals, which are sometimes referred to as extremely high frequency (EHF) signals, propagate at frequencies above about 30 GHz (e.g., at 60 GHz or other frequencies between about 30 GHz and 300 GHz). Centimeter wave signals propagate at frequencies between about 10 GHz and 30 GHz. If desired, device 10 may also contain antennas for handling satellite navigation system signals, cellular telephone signals, local wireless area network signals, near-field communications, light-based wireless communications, or other wireless communications.

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

As shown in FIG. 1, device 10 may include a housing such as housing 22. Housing 22 may be formed using a unibody configuration in which some or all of housing 22 is machined or molded as a single structure or may be formed using multiple structures (e.g., an internal frame structure, one or more structures that form exterior housing surfaces, etc.). Antennas may be mounted along the peripheral edges of housing 22, on a rear of housing 22, under a dielectric window in a conductive portion of housing 22, or at any other desired location in device 10.

Device 10 may include control circuitry 28. Control circuitry 28 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc. Control circuitry 28 may include processing circuitry such as processing circuitry 32. Processing circuitry 32 may be used to control the operation of device 10. Processing circuitry 32 may include on one or more microprocessors, microcontrollers, digital signal processors, host processors, baseband processor integrated circuits, application specific integrated circuits, central processing units (CPUs), etc. Control circuitry 28 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 28 may be used to run software on device 10 such as internet browsing applications, voice-over-internet-protocol (VOIP) telephone call applications, email applications, media playback applications, operating system functions, etc. To support interactions with external equipment, control circuitry 28 may be used in implementing communications protocols. Communications protocols that may be implemented using control circuitry 28 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 24. Input-output circuitry 24 may include input-output devices 26. Input-output devices 26 may be used to allow data to be supplied to device 10 and to allow data to be provided from device 10 to external devices. Input-output devices 26 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 24 may include wireless circuitry such as wireless circuitry 34 for wirelessly conveying radio-frequency signals. While control circuitry 28 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 28 (e.g., portions of control circuitry 28 may be implemented on wireless circuitry 34). As an example, control circuitry 28 may include baseband processor circuitry or other control components that form a part of wireless circuitry 34.

Wireless circuitry 34 may include millimeter and centimeter wave transceiver circuitry such as millimeter/centimeter wave transceiver circuitry 38. Millimeter/centimeter wave transceiver circuitry 38 may support communications at frequencies between about 10 GHz and 300 GHz. For example, millimeter/centimeter wave transceiver circuitry 38 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter/centimeter wave transceiver circuitry 38 may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, millimeter/centimeter wave transceiver circuitry 38 may support IEEE 802.11ad communications at 60 GHz and/or $5^{th}$ generation mobile networks or $5^{th}$ generation wireless systems (5G) communications bands between 27 GHz and 90 GHz. Millimeter/centimeter wave transceiver circuitry 38 may be formed from one or more integrated circuits (e.g., multiple integrated circuits mounted on a common printed circuit in a system-in-package device, one or more integrated circuits mounted on different substrates, etc.).

If desired, millimeter/centimeter wave transceiver circuitry 38 (sometimes referred to herein simply as transceiver circuitry 38 or millimeter/centimeter wave circuitry 38) may perform spatial ranging operations using radio-frequency signals at millimeter and/or centimeter wave signals that are transmitted and received by millimeter/centimeter wave transceiver circuitry 38. The received signals may be a version of the transmitted signals that have been reflected off of external objects and back towards device 10. Control circuitry 28 may process the transmitted and received signals to detect or estimate a range between device 10 and one or more external objects in the surroundings of device 10 (e.g., objects external to device 10 such as the body of a user or other persons, other devices, animals, furniture, walls, or other objects or obstacles in the vicinity of device 10). If desired, control circuitry 28 may also process the transmitted and received signals to identify a two or three-dimensional spatial location of the external objects relative to device 10.

Spatial ranging operations performed by millimeter/centimeter wave transceiver circuitry 38 are unidirectional. Millimeter/centimeter wave transceiver circuitry 38 may perform bidirectional communications with external wireless equipment. Bidirectional communications involve both the transmission of wireless data by millimeter/centimeter wave transceiver circuitry 38 and the reception of wireless data that has been transmitted by external wireless equipment. The wireless data may, for example, include data that has been encoded into corresponding data packets such as wireless data associated with a telephone call, streaming media content, internet browsing, wireless data associated with software applications running on device 10, email messages, etc.

If desired, wireless circuitry 34 may include transceiver circuitry for handling communications at frequencies below 10 GHz such as non-millimeter/centimeter wave transceiver circuitry 36. Non-millimeter/centimeter wave transceiver circuitry 36 may include wireless local area network (WLAN) transceiver circuitry that handles 2.4 GHz and 5 GHz bands for Wi-Fi® (IEEE 802.11) communications, wireless personal area network (WPAN) transceiver circuitry that handles the 2.4 GHz Bluetooth® communications band, cellular telephone transceiver circuitry that handles cellular telephone communications bands from 700 to 960 MHz, 1710 to 2170 MHz, 2300 to 2700 MHz, and/or or any other desired cellular telephone communications bands between 600 MHz and 4000 MHz, GPS receiver circuitry that receives GPS signals at 1575 MHz or signals for handling other satellite positioning data (e.g., GLONASS signals at 1609 MHz), television receiver circuitry, AM/FM radio receiver circuitry, paging system transceiver circuitry, near field communications (NFC) circuitry, etc. Non-millimeter/centimeter wave transceiver circuitry 36 and millimeter/centimeter wave transceiver circuitry 38 may each include one or more integrated circuits, power amplifier circuitry, low-noise input amplifiers, passive radio-frequency components, switching circuitry, transmission line structures, and other circuitry for handling radio-frequency signals.

Wireless circuitry 34 may include antennas 40. Non-millimeter/centimeter wave transceiver circuitry 36 may transmit and receive radio-frequency signals below 10 GHz using one or more antennas 40. Millimeter/centimeter wave transceiver circuitry 38 may transmit and receive radio-frequency signals above 10 GHz (e.g., at millimeter wave and/or centimeter wave frequencies) using antennas 40.

In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. Millimeter/centimeter wave transceiver circuitry 38 may convey radio-frequency signals over short distances that travel over a line-of-sight path. To enhance signal reception for millimeter and centimeter wave communications, phased antenna arrays and beam steering techniques may be used (e.g., schemes in which antenna signal phase and/or magnitude for each antenna in an array are adjusted to perform beam steering). Antenna diversity schemes may also be used to ensure that the antennas that have become blocked or that are otherwise degraded due to the operating environment of device 10 can be switched out of use and higher-performing antennas used in their place.

Antennas 40 in wireless circuitry 34 may be formed using any suitable antenna types. For example, antennas 40 may include antennas with resonating elements that are formed from stacked patch antenna structures, loop antenna structures, patch antenna structures, inverted-F antenna structures, slot antenna structures, planar inverted-F antenna structures, monopole antenna structures, dipole antenna structures, helical antenna structures, Yagi (Yagi-Uda) antenna structures, hybrids of these designs, etc. In another suitable arrangement, antennas 40 may include antennas with dielectric resonating elements such as dielectric resonator antennas. If desired, one or more of antennas 40 may be cavity-backed antennas. Different types of antennas may be used for different bands and combinations of bands. For example, one type of antenna may be used in forming a non-millimeter/centimeter wave wireless link for non-millimeter/centimeter wave transceiver circuitry 36 and another type of antenna may be used in conveying radio-frequency signals at millimeter and/or centimeter wave frequencies for millimeter/centimeter wave transceiver circuitry 38. Antennas 40 that are used to convey radio-frequency signals at millimeter and centimeter wave frequencies may be arranged in one or more phased antenna arrays.

Figure 2:
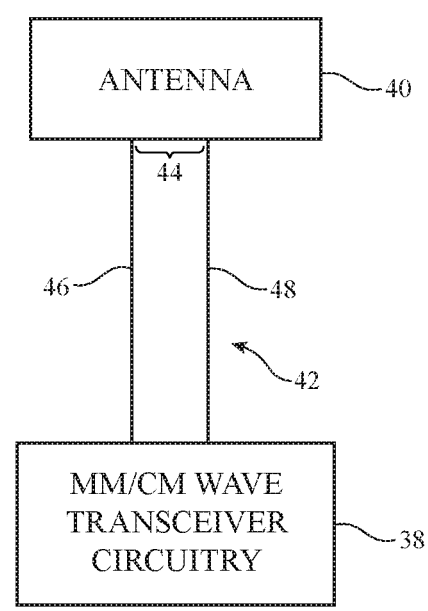
FIG. 2 is a schematic diagram of illustrative wireless circuitry in an electronic device in accordance with some embodiments.

A schematic diagram of an antenna 40 that may be formed in a phased antenna array for conveying radio-frequency signals at millimeter and centimeter wave frequencies is shown in FIG. 2. As shown in FIG. 2, antenna 40 may be coupled to millimeter/centimeter (MM/CM) wave transceiver circuitry 38. Millimeter/centimeter wave transceiver circuitry 38 may be coupled to antenna feed 44 of antenna 40 using a transmission line path that includes radio-frequency transmission line 42. Radio-frequency transmission line 42 may include a positive signal conductor such as signal conductor 46 and may include a ground conductor such as ground conductor 48. Ground conductor 48 may be coupled to the antenna ground for antenna 40 (e.g., over a ground antenna feed terminal of antenna feed 44 located on the antenna ground). Signal conductor 46 may be coupled to the antenna resonating element for antenna 40. For example, signal conductor 46 may be coupled to a positive antenna feed terminal of antenna feed 44 located on the antenna resonating element. In another suitable arrangement, antenna 40 may be indirectly fed. For example, signal conductor 46 may indirectly feed radio-frequency signals to a portion of antenna 40 via near-field electromagnetic coupling and the antenna resonating element for antenna 40 may radiate the indirectly-fed radio-frequency signals.

Radio-frequency transmission line 42 may include a stripline transmission line (sometimes referred to herein simply as a stripline), a coaxial cable, a coaxial probe realized by metalized vias, a microstrip transmission line, an edge-coupled microstrip transmission line, an edge-coupled stripline transmission lines, a waveguide structure, combinations of these, etc. Multiple types of transmission lines may be used to form the transmission line path that couples millimeter/centimeter wave transceiver circuitry 38 to antenna feed 44. Filter circuitry, switching circuitry, impedance matching circuitry, phase shifter circuitry, amplifier circuitry, and/or other circuitry may be interposed on radio-frequency transmission line 42, if desired.

Radio-frequency transmission lines in device 10 may be integrated into ceramic substrates, rigid printed circuit boards, and/or flexible printed circuits. In one suitable arrangement, radio-frequency transmission lines in device 10 may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Figure 3:
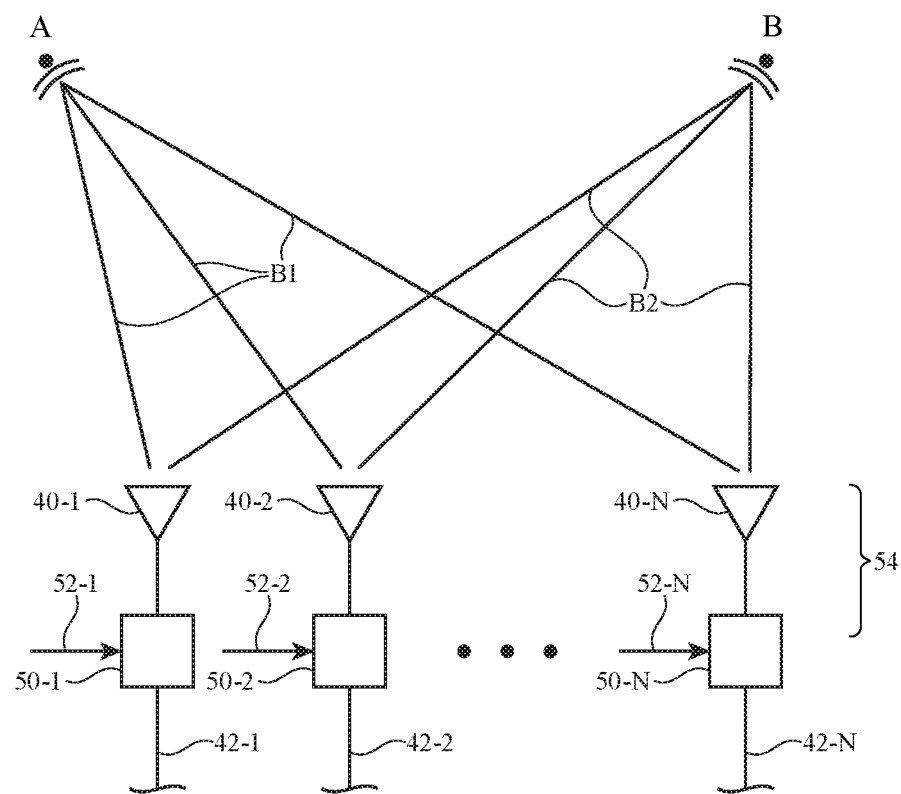
FIG. 3 is a diagram of an illustrative phased antenna array in an electronic device in accordance with some embodiments.

FIG. 3 shows how antennas 40 for handling radio-frequency signals at millimeter and centimeter wave frequencies may be formed in a phased antenna array. As shown in FIG. 3, phased antenna array 54 (sometimes referred to herein as array 54, antenna array 54, or array 54 of antennas 40) may be coupled to radio-frequency transmission lines 42. For example, a first antenna 40-1 in phased antenna array 54 may be coupled to a first radio-frequency transmission line 42-1, a second antenna 40-2 in phased antenna array 54 may be coupled to a second radio-frequency transmission line 42-2, an Nth antenna 40-N in phased antenna array 54 may be coupled to an Nth radio-frequency transmission line 42-N, etc. While antennas 40 are described herein as forming a phased antenna array, the antennas 40 in phased antenna array 54 may sometimes also be referred to as collectively forming a single phased array antenna.

Antennas 40 in phased antenna array 54 may be arranged in any desired number of rows and columns or in any other desired pattern (e.g., the antennas need not be arranged in a grid pattern having rows and columns). During signal transmission operations, radio-frequency transmission lines 42 may be used to supply signals (e.g., radio-frequency signals such as millimeter wave and/or centimeter wave signals) from millimeter/centimeter wave transceiver circuitry 38 (FIG. 2) to phased antenna array 54 for wireless transmission. During signal reception operations, radio-frequency transmission lines 42 may be used to convey signals received at phased antenna array 54 (e.g., from external wireless equipment or transmitted signals that have been reflected off of external objects) to millimeter/centimeter wave transceiver circuitry 38 (FIG. 2).

The use of multiple antennas 40 in phased antenna array 54 allows beam steering arrangements to be implemented by controlling the relative phases and magnitudes (amplitudes) of the radio-frequency signals conveyed by the antennas. In the example of FIG. 3, antennas 40 each have a corresponding radio-frequency phase and magnitude controller 50 (e.g., a first phase and magnitude controller 50-1 interposed on radio-frequency transmission line 42-1 may control phase and magnitude for radio-frequency signals handled by antenna 40-1, a second phase and magnitude controller 50-2 interposed on radio-frequency transmission line 42-2 may control phase and magnitude for radio-frequency signals handled by antenna 40-2, an Nth phase and magnitude controller 50-N interposed on radio-frequency transmission line 42-N may control phase and magnitude for radio-frequency signals handled by antenna 40-N, etc.).

Phase and magnitude controllers 50 may each include circuitry for adjusting the phase of the radio-frequency signals on radio-frequency transmission lines 42 (e.g., phase shifter circuits) and/or circuitry for adjusting the magnitude of the radio-frequency signals on radio-frequency transmission lines 42 (e.g., power amplifier and/or low noise amplifier circuits). Phase and magnitude controllers 50 may sometimes be referred to collectively herein as beam steering circuitry (e.g., beam steering circuitry that steers the beam of radio-frequency signals transmitted and/or received by phased antenna array 54).

Phase and magnitude controllers 50 may adjust the relative phases and/or magnitudes of the transmitted signals that are provided to each of the antennas in phased antenna array 54 and may adjust the relative phases and/or magnitudes of the received signals that are received by phased antenna array 54. Phase and magnitude controllers 50 may, if desired, include phase detection circuitry for detecting the phases of the received signals that are received by phased antenna array 54. The term "beam" or "signal beam" may be used herein to collectively refer to wireless signals that are transmitted and received by phased antenna array 54 in a particular direction. The signal beam may exhibit a peak gain that is oriented in a particular pointing direction at a corresponding pointing angle (e.g., based on constructive and destructive interference from the combination of signals from each antenna in the phased antenna array). The term "transmit beam" may sometimes be used herein to refer to radio-frequency signals that are transmitted in a particular direction whereas the term "receive beam" may sometimes be used herein to refer to radio-frequency signals that are received from a particular direction.

If, for example, phase and magnitude controllers 50 are adjusted to produce a first set of phases and/or magnitudes for transmitted radio-frequency signals, the transmitted signals will form a transmit beam as shown by beam B1 of FIG. 3 that is oriented in the direction of point A. If, however, phase and magnitude controllers 50 are adjusted to produce a second set of phases and/or magnitudes for the transmitted signals, the transmitted signals will form a transmit beam as shown by beam B2 that is oriented in the direction of point B. Similarly, if phase and magnitude controllers 50 are adjusted to produce the first set of phases and/or magnitudes, radio-frequency signals (e.g., radio-frequency signals in a receive beam) may be received from the direction of point A, as shown by beam B1. If phase and magnitude controllers 50 are adjusted to produce the second set of phases and/or magnitudes, radio-frequency signals may be received from the direction of point B, as shown by beam B2.

Each phase and magnitude controller 50 may be controlled to produce a desired phase and/or magnitude based on a corresponding control signal 52 received from control circuitry 28 of FIG. 1 (e.g., the phase and/or magnitude provided by phase and magnitude controller 50-1 may be controlled using control signal 52-1, the phase and/or magnitude provided by phase and magnitude controller 50-2 may be controlled using control signal 52-2, etc.). If desired, the control circuitry may actively adjust control signals 52 in real time to steer the transmit or receive beam in different desired directions over time. Phase and magnitude controllers 50 may provide information identifying the phase of received signals to control circuitry 28 if desired.

When performing wireless communications using radio-frequency signals at millimeter and centimeter wave frequencies, the radio-frequency signals are conveyed over a line of sight path between phased antenna array 54 and external communications equipment. If the external object is located at point A of FIG. 3, phase and magnitude controllers 50 may be adjusted to steer the signal beam towards point A (e.g., to steer the pointing direction of the signal beam towards point A). Phased antenna array 54 may transmit and receive radio-frequency signals in the direction of point A. Similarly, if the external communications equipment is located at point B, phase and magnitude controllers 50 may be adjusted to steer the signal beam towards point B (e.g., to steer the pointing direction of the signal beam towards point B). Phased antenna array 54 may transmit and receive radio-frequency signals in the direction of point B. In the example of FIG. 3, beam steering is shown as being performed over a single degree of freedom for the sake of simplicity (e.g., towards the left and right on the page of FIG. 3). However, in practice, the beam may be steered over two or more degrees of freedom (e.g., in three dimensions, into and out of the page and to the left and right on the page of FIG. 3). Phased antenna array 54 may have a corresponding field of view over which beam steering can be performed (e.g., in a hemisphere or a segment of a hemisphere over the phased antenna array). If desired, device 10 may include multiple phased antenna arrays that each face a different direction to provide coverage from multiple sides of the device.

Portions of the wireless circuitry in the device (e.g., wireless circuitry 34 of FIG. 1) may be tested in a wireless test system to ensure that the wireless circuitry is operating properly. The wireless test system may include wireless test equipment. The wireless test equipment may, for example, perform radio-frequency test operations on portions of wireless circuitry 34 before wireless circuitry 34 is fully assembled and/or before wireless circuitry 34 is assembled into device 10. The portions of wireless circuitry 34 that are tested using the wireless test equipment may sometimes be referred to herein as wireless circuitry under test or, more simply, as circuitry under test (CUT). The CUT may include some or all of antennas 40, portions of one or more of antennas 40, some or all of millimeter/centimeter wave transceiver circuitry 38, portions of non-millimeter/centimeter wave transceiver circuitry 36, other portions of wireless circuitry 34, and/or portions of control circuitry 28 of FIG. 1. In one suitable arrangement that is sometimes described herein as an example, the circuitry under test includes at least phased antenna array 54 of FIG. 3.

Figure 4:
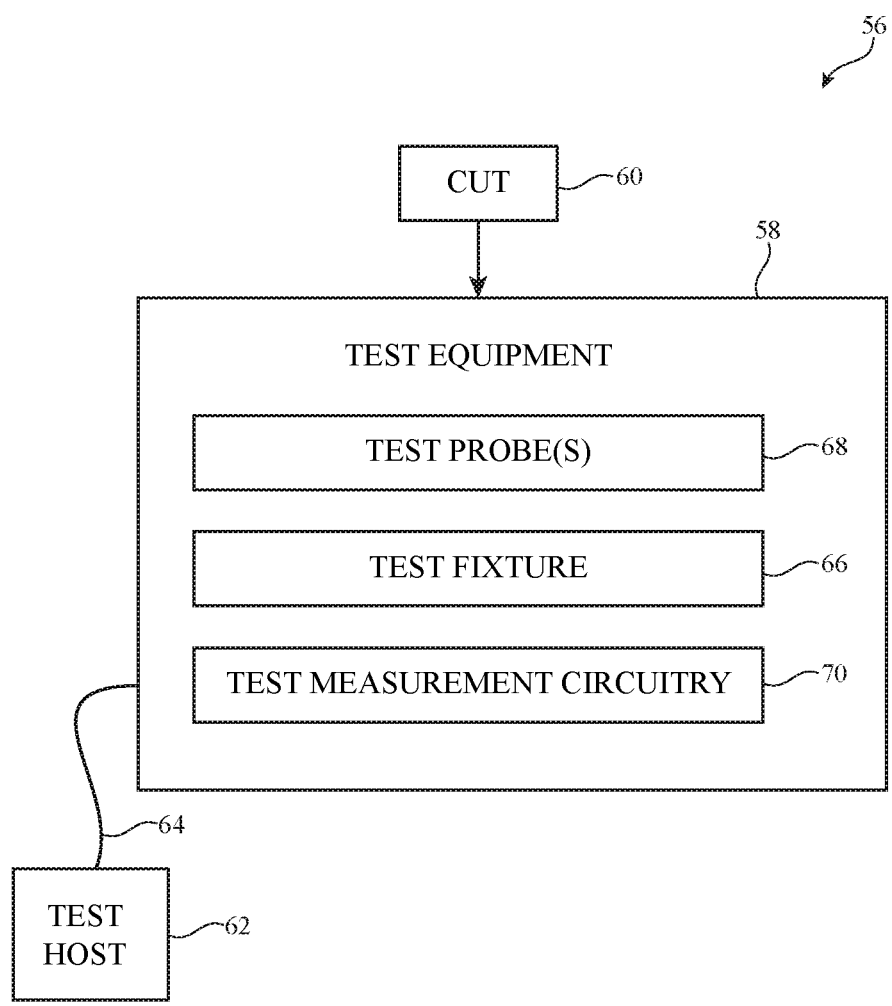
FIG. 4 is a diagram of an illustrative wireless test system for performing radio-frequency test operations on wireless circuitry under test in accordance with some embodiments.

FIG. 4 shows an illustrative wireless test system that may be used to perform radio-frequency test operations on circuitry under test. As shown in FIG. 4, a wireless test system such as test system 56 may include wireless test equipment such as test equipment 58 and a test host such as test host 62. Test host 62 may be coupled to test equipment 58 over data path 64. Data path 64 may include one or more control lines, a data bus, or any other lines for conveying control signals and test data between test host 62 and test equipment 58.

Test host 62 may include computing equipment such as a personal computer, laptop computer, handheld or portable computer, or any other desired computing equipment. Test host 62 may be formed separate from (e.g., external to) test equipment 58. In another suitable arrangement, test host 62 and test equipment 58 may be combined into a single testing device.

Test equipment 58 may include test fixture 66, test measurement circuitry 70, and one or more test probes 68. Test equipment 58 may receive circuitry under test (CUT) 60. Test equipment 58 may perform radio-frequency test operations on CUT 60. For example, CUT 60 may be mounted to test fixture 66. Test host 62 may control CUT 60 in test fixture 66 to transmit and/or receive radio-frequency test signals (e.g., radio-frequency test signals at millimeter and/or centimeter wave frequencies). Test measurement circuitry 70 may gather measurements (sometimes referred to herein as radio-frequency test data or test data) from the radio-frequency signals transmitted by CUT 60 using test probes 68. Test measurement circuitry 70 may convey the test data to test host 62 over data path 64. Test host 62 may analyze the test data to determine whether CUT 60 exhibits satisfactory radio-frequency performance.

The test data may include test data associated with any desired wireless performance metrics for CUT 60 (e.g., error rate data, noise data, signal to noise ratio data, received or transmitted power level data, etc.). In one suitable arrangement that is sometimes described herein as an example, the test data may include measurements of the radiation pattern of CUT 60. The measurements of the radiation pattern of CUT 60 may include electric field magnitude and/or phase information associated with the radio-frequency test signals transmitted by CUT 60. Test host 62 may process measurements of the radiation pattern of CUT 60 to determine whether CUT 60 exhibits satisfactory radio-frequency performance (e.g., to determine whether antennas in CUT 60 exhibit sufficient gain at desired beam steering angles).

Figure 5:
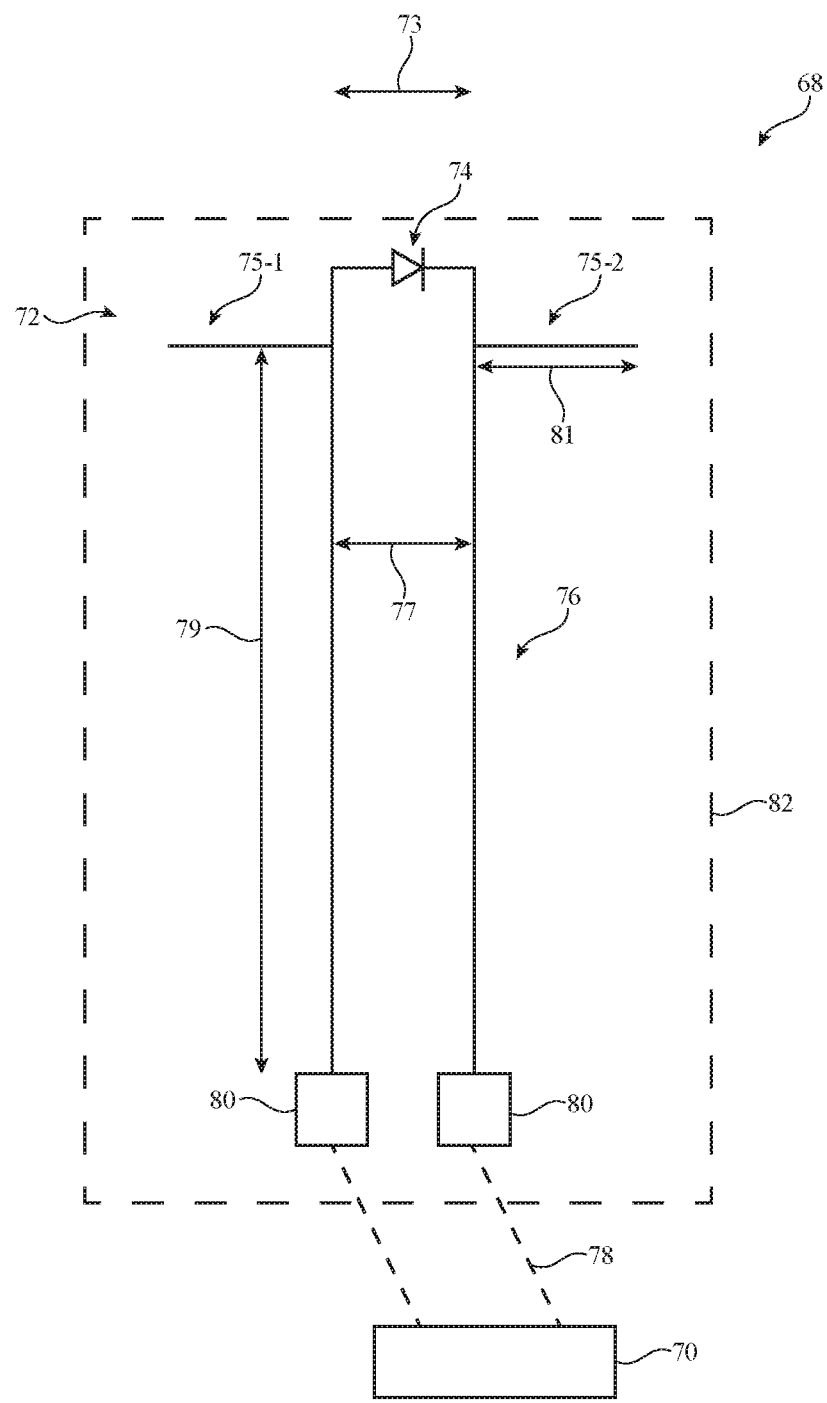
FIG. 5 is a diagram of an illustrative test probe that may be used to perform radio-frequency test operations on wireless circuitry under test in accordance with some embodiments.

Test probes 58 may include one or more antenna elements (sometimes referred to herein as test antenna elements) that are used to receive the radio-frequency test signals transmitted by CUT 60 (e.g., to identify the radiation pattern of CUT 60). In one suitable arrangement that is described herein as an example, the antenna elements in test probe 58 are implemented using dipole antenna structures. Antenna elements that are implemented using dipole antenna structures may sometimes be referred to herein as dipole elements. FIG. 5 is a diagram of an illustrative test probe 68 having a dipole element for receiving the radio-frequency test signals transmitted by CUT 60.

As shown in FIG. 5, test probe 68 may include dipole antenna element such as dipole element 72 (sometimes referred to herein as dipole 72, dipole antenna element 72, dipole antenna 72, test dipole 72, or test dipole element 72). Dipole element 72 may be formed using conductive traces printed (patterned) on an underlying dielectric substrate such as dielectric substrate 82. The conductive traces may include copper, silver, gold, indium tin oxide, and/or other materials. In some suitable arrangement, the conductive traces may include metal traces (e.g., copper or silver traces) coupled to underlying indium tin oxide traces. Dielectric substrate 82 may be formed from glass, plastic, polymer, ceramic, and/or any other desired dielectric materials. Dipole element 72 may include a first dipole arm 75-1 and a second dipole arm 75-2. A diode such as diode 74 may be coupled between dipole arms 75-1 and 75-2. Diode 74 may, for example, be surface-mounted to dielectric substrate 82. Dipole arms 75-1 and 75-2 may each have length 81. Length 81 may be less than the wavelength of the radio-frequency test signals transmitted by the circuitry under test. This may allow the dipole arms to perform test measurements without significantly perturbing the electric field in the vicinity of dipole element 72. Length 81 may be, for example, between 0.6 mm and 1.0 mm, between 0.4 mm and 1.2 mm, or other lengths.

Dipole element 72 may be coupled to conductive contact pads 80 on dielectric substrate 82 over transmission line 76. Transmission line 76 may include a first conductive line that couples dipole arm 75-1 to a first contact pad 80 and a second conductive line that couples dipole arm 75-2 to a second contact pad 80. Contact pads 80 may be coupled to test measurement circuitry 70 over signal paths 78. Test measurement circuitry 70 may include analog-to-digital converter circuitry, voltmeter circuitry, and/or any other desired circuitry for measuring radio-frequency signals received at dipole element 72.

During radio-frequency test operations, dipole element 72 may receive radio-frequency test signals transmitted by circuitry under test (e.g., CUT 60 of FIG. 4). Dipole element 72 may serve as an electric field probe for the received radio-frequency test signals. For example, the electric field component of the received radio-frequency test signals extending parallel to the longitudinal axis of dipole arms 75-1 and 75-2, as shown by arrow 73, may produce corresponding antenna currents on dipole arms 75-1 and 75-2. Diode 74 may serve as a rectifier that converts the radio-frequency antenna currents to a rectified voltage between dipole arms 75-1 and 75-2.

Transmission line 76 may be configured to form a low pass filter for dipole element 72. This may serve to prevent scattering of the radio-frequency test signals by transmission line 76 and to prevent radio-frequency currents from passing to test measurement circuitry 70 from dipole element 72. Transmission line 76 may have length 79 extending from dipole element 72 to contact pads 80. The first and second conductive lines in transmission line 76 may be separated by distance 77. The material used to form transmission line 76, length 79, and/or distance 77 may be selected to provide transmission line 76 with a relatively high resistance (e.g., a resistance greater than 1 M$\Omega$) that configures transmission line 76 to serve as a low pass filter (e.g., a filter that blocks radio-frequency signals at frequencies greater than 700 MHz while passing lower frequencies). Length 79 may be, for example, between 10 cm and 30 cm, between 1 cm and 40 cm, between 5 cm and 35 cm, between 10 cm and 20 cm, greater than 1 cm, greater than 10 cm, greater than 20 cm, etc. Distance 77 may be, for example, between 25 and 30 microns, between 20 and 35 microns, between 15 and 40 microns, between 10 and 50 microns, greater than 10 microns, greater than 20 microns, less than 30 microns, less than 50 microns, etc. Transmission line 76 may be formed using conductive traces on dielectric substrate 82. The conductive traces may be formed from a relatively high-resistance conductive material such as indium tin oxide (ITO), graphene, other thin-films, or other materials. In general, length 79 may be lower when transmission line 76 is formed using materials with greater resistivity and may be higher when transmission line 76 is formed using materials with lower resistivity (e.g., to configure transmission line 76 to exhibit a resistance per length that is greater than a minimum resistance per length threshold value that allows the transmission line to convert the rectified voltage into a direct current voltage).

Forming a low pass filter using transmission line 76 may allow the transmission line to filter the rectified voltage to produce a direct current (DC) voltage. Test measurement circuitry 70 may sense (measure) the rectified voltage (e.g., the DC voltage) across contact pads 80. In general, the sensed DC voltage is proportional to the magnitude of the electric field of the received radio-frequency signals (e.g., the magnitude of the component of the electric field parallel to arrow 73). Test measurement circuitry 70 and/or the test host (e.g., test host 62 of FIG. 4) may convert the sensed DC voltage into electric field magnitude values by multiplying the sensed DC voltage by a constant value. The test data provided by test measurement circuitry 70 to the test host 62 may include the DC voltages and/or the electric field magnitude values gathered by test measurement circuitry 70. Test probe 68 may be used to gather the DC voltage and electric field magnitude from the transmitted radio-frequency test signals at multiple points over the circuitry under test. This may allow the wireless test equipment to characterize the transmitted radio-frequency test signals across the entire field of view of the circuitry under test and thus the radiation pattern of the circuitry under test.

Test probe 68 of FIG. 5 may only be capable of measuring a single linear component (e.g., polarization) of the received radio-frequency test signals. For example, test probe 68 may measure the electric field component extending parallel to arrow 73. The electric field component of the received radio-frequency test signals orthogonal to arrow 73 may not produce antenna currents on dipole arms 75-1 and 75-2 or a DC voltage across dipole element 72. If desired, test probe 68 may include additional dipole elements oriented perpendicular to each other to measure the electric field component orthogonal to arrow 73. In another suitable arrangement, test probe 68 of FIG. 5 may be rotated over time to measure different electric field components using a single dipole element.

Figure 6:
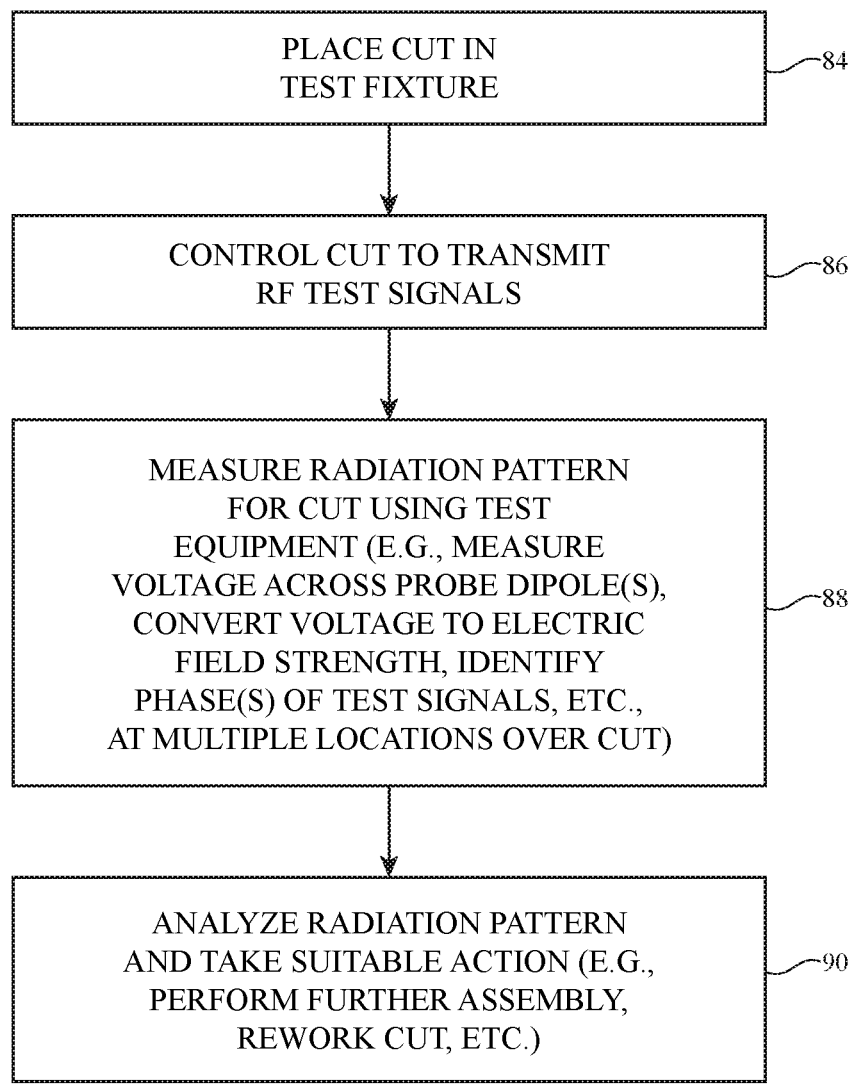
FIG. 6 is a flow chart of illustrative steps involved with performing radio-frequency test operations on wireless circuitry under test in accordance with some embodiments.

FIG. 6 is a flow chart of illustrative steps that may be performed by test system 56 of FIG. 4 for performing radio-frequency test operations on CUT 60 (e.g., using one or more test probes 68). CUT 60 may include at least phased antenna array 54 of FIG. 3.

At step 84, CUT 60 is placed onto test fixture 66 of FIG. 4. Test fixture 66 may hold CUT 60 in place during testing. CUT 60 may be mounted to test fixture 66 by an operator of test system 56 or by automated test equipment.

At step 86, test host 62 may control the phased antenna array in CUT 60 to transmit radio-frequency test signals (e.g., by conveying control signals to test equipment 58 over data path 64 of FIG. 4). CUT 60 may subsequently transmit the radio-frequency test signals towards one or more test probe 68.

At step 88, one or more test probes 68 may measure the radiation pattern for CUT 60 based on the transmitted radio-frequency test signals. For example, dipole element 72 and diode 74 on test probe 68 (FIG. 5) may produce a rectified voltage in response to the electric field component of the transmitted radio-frequency test signals that extends parallel to dipole arms 75-1 and 75-2 of dipole element 72. Test measurement circuitry 70 may measure the rectified voltage (e.g., the DC voltage generated by the transmission line after filtering the rectified voltage). Test measurement circuitry 70 and/or test host 62 may convert the DC voltage to an electric field magnitude value (sometimes referred to as an electric field strength value) by multiplying the DC voltage by a constant value.

Test probe 68 and test measurement circuitry 70 may gather DC voltages and/or electric field magnitude values at multiple positions within the field of view of the phased antenna array in CUT 60. For example, the test host may control CUT 60 to scan over different beam steering angles (e.g., all possible beam steering angles) while transmitting the radio-frequency test signals. The test equipment may gather corresponding DC voltages and electric field magnitude values for each of the beam steering angles.

If desired, test probe 68 may gather DC voltages and/or electric field magnitude values at multiple distances from CUT 60. This may allow the test system (e.g., test host 62) to calculate the phase of the radio-frequency test signals (e.g., at the plane of CUT 60) in addition to the electric field magnitudes. The electric field magnitudes and optionally the phases sampled at different locations may provide information about the radiation pattern of CUT 60 (sometimes referred to herein as the measured radiation pattern of CUT 60). Test measurement circuitry 70 may convey the electric field magnitudes and DC voltages as test data to test host 62.

At step 90, test host 62 may analyze the measured radiation pattern of CUT 60 received from test measurement circuitry 70. For example, test host 62 may determine whether CUT 60 has passed or failed testing by comparing the measured radiation pattern of CUT 60 (e.g., as identified by the DC voltages, electric field magnitudes, and/or phases in the test data) to a predetermined or expected radiation pattern for CUT 60. If the measured radiation pattern differs excessively from the predetermined radiation pattern, CUT 60 may be labeled as failing testing, may be scrapped, may be re-designed, may be provided to other test equipment for performing additional testing, and/or may be re-assembled. If the measured radiation pattern matches or is sufficiently close to the predetermined radiation pattern, CUT 60 may be labeled as passing testing, may be further assembled into wireless circuitry 34 (FIG. 1), may be assembled into a completed device 10, and/or may be provided to other test equipment for performing additional testing.

Figure 7:
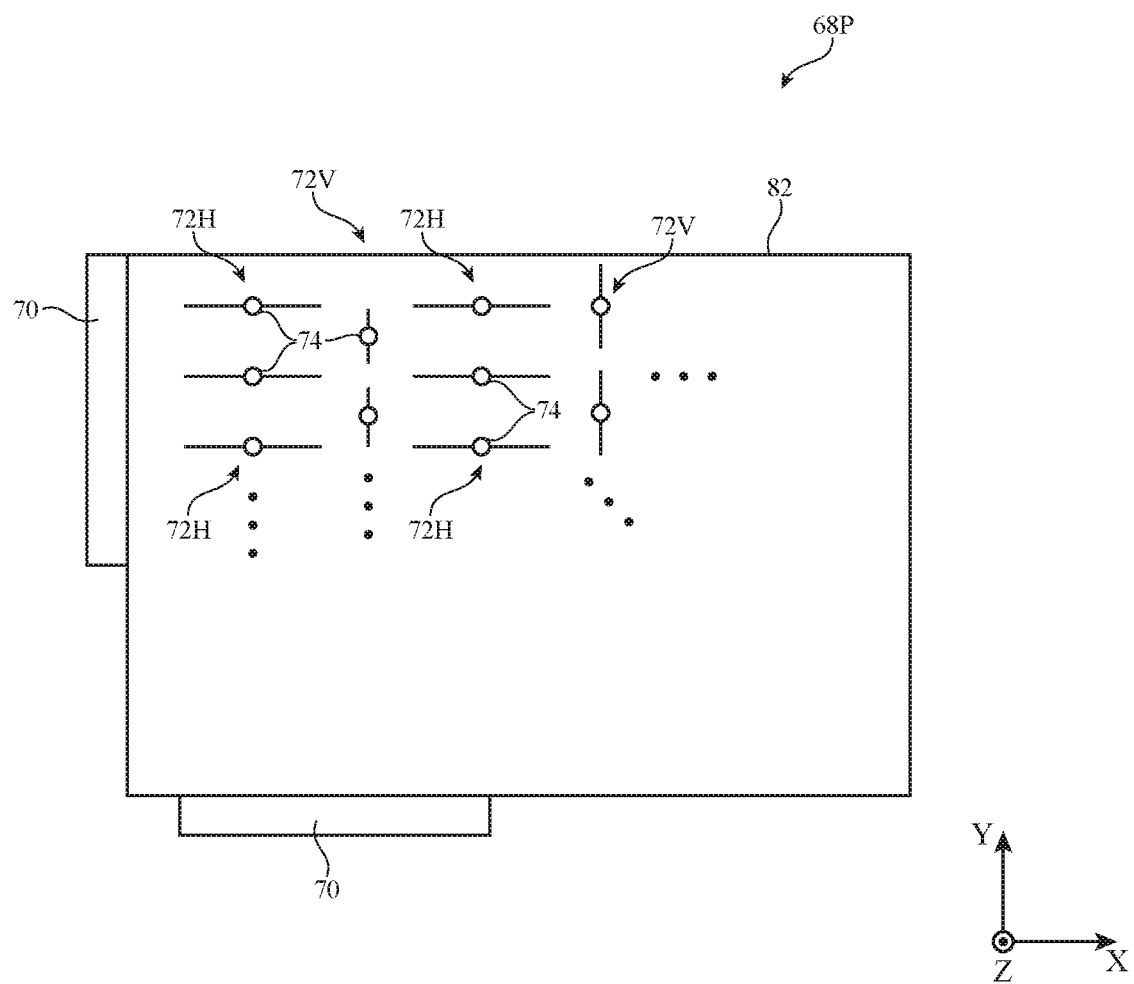
FIG. 7 is a bottom-up view of an illustrative planar test probe having an array of dipole elements for measuring the radiation pattern of wireless circuitry under test in accordance with some embodiments.

If desired, test probe 68 may include multiple dipole elements 72 for concurrently sampling the electric field (radiation pattern) of CUT 60 at multiple locations. In one suitable arrangement, test probe 68 may be a planar test probe having multiple dipole elements 72. FIG. 7 is a bottom-up view of a planar test probe having multiple dipole elements.

As shown in FIG. 7, test probe 68 may be configured as a planar test probe 68P. Planar test probe 68P may include multiple dipole elements 72V and 72H formed on a lateral (bottom) surface of dielectric substrate 82. Dipole elements 72V and 72H may, for example, be concurrently patterned onto dielectric substrate 82 during an indium tin oxide deposition process. Planar test probe 68P may be configured to sample different (e.g., orthogonal) electric field components of the received radio-frequency test signals. For example, dipole elements 72H may sample the electric field component extending parallel to the X-axis whereas dipole elements 72V sample the electric field component extending parallel to the Y-axis. Dipole elements 72V may be interspersed or interleaved among dipole elements 72H on planar test probe 68P. For example, dipole elements 72V and dipole elements 72H may be arranged in an array (e.g., an array having alternating rows and/or columns of dipole elements 72V and 72H) or in other patterns.

Test measurement circuitry 70 may be mounted to one or more sides of planar test probe 68P. Transmission lines (e.g., transmission lines 76 of FIG. 5, not shown in FIG. 7 for the sake of clarity) may route rectified voltages measured by each dipole element 72V and each dipole element 72H to test measurement circuitry 70. In one suitable arrangement dipole elements 72V may be coupled to test measurement circuitry 70 mounted to a first side of dielectric substrate 82 whereas dipole elements 72H are coupled to test measurement circuitry 70 mounted to a second side of dielectric substrate 82.

During radio-frequency test operations (e.g., while processing step 88 of FIG. 6), the diodes 74 on each dipole element 72V and each dipole element 72H may produce rectified voltages in response to radio-frequency test signals transmitted by CUT 60 (FIG. 4) and received at planar test probe 68P. The rectified voltages may be sampled (e.g., as DC voltages) by test measurement circuitry 70. Test measurement circuitry 70 and/or test host 62 (FIG. 4) may convert the DC voltages into electric field magnitude values. This may allow the test host to identify the electric field magnitude of the radio-frequency test signals at different locations across the lateral area of planar test probe 68P (e.g., at different X and Y coordinates). The test host may use the electric field magnitude values gathered by dipole elements 72H to interpolate the magnitude of the electric field component parallel to the X-axis at the locations of dipole elements 72V. Similarly, the test host may use the electric field magnitude values gathered by dipole elements 72V to interpolate the magnitude of the electric field component parallel to the Y-axis at the locations of dipole elements 72H. In this way, the test host may identify the electric field strength of the radio-frequency test signals across the X-Y plane of FIG. 7 and thus the radiation pattern for the circuitry under test.

Figure 8:
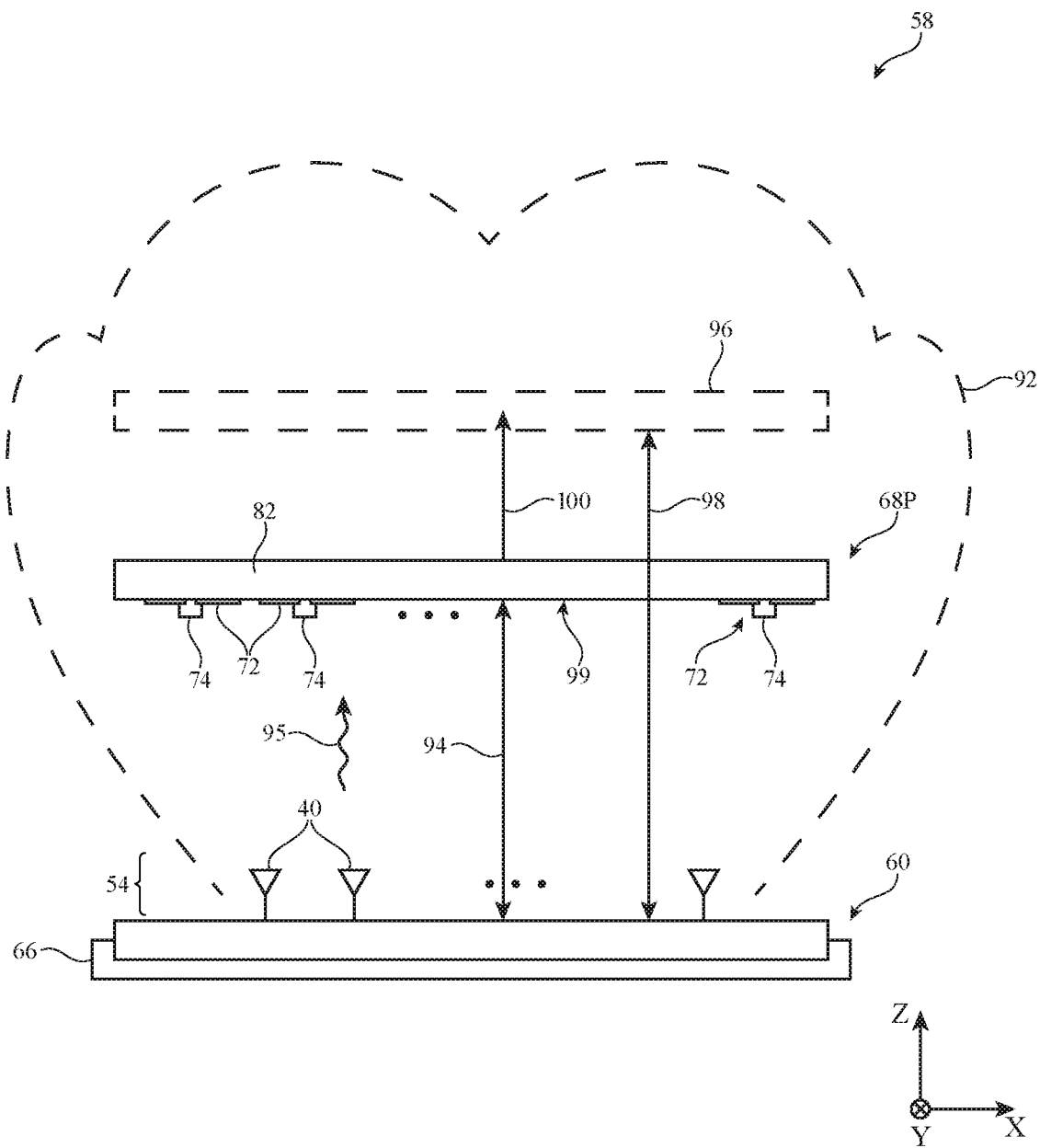
FIG. 8 is a side view showing how an illustrative planar test probe may be placed over wireless circuitry under test for measuring the radiation pattern of the wireless circuitry under test in accordance with some embodiments.

FIG. 8 is a cross-sectional side view showing how a planar test probe such as planar test probe 68P of FIG. 7 may be used to measure the radiation pattern of circuitry under test. As shown in FIG. 8, CUT 60 may include a phased antenna array 54 having two or more antennas 40. CUT 60 may be mounted to test fixture 66 in test equipment 58.

Dipole elements 72 and diodes 74 may be formed at bottom (lateral) surface 99 of dielectric substrate 82 in planar test probe 68P. Planar test probe 68P may be held at distance 94 from CUT 60 with bottom surface 99 facing CUT 60 (e.g., by an operator of test equipment 58, by additional test fixture hardware, by automated equipment, etc.). During radio-frequency test operations, the test host may control CUT 60 to transmit radio-frequency test signals 95 (e.g., while processing step 86 of FIG. 6). Phased antenna array 54 on CUT 60 may exhibit a radiation pattern envelope 92. Radiation pattern envelope 92 may be a curve representing change in maximum gain for phased antenna array 54 under all possible beam steering settings (e.g., over the entire field of view for the phased antenna array).

Dipole elements 72 and diodes 74 may generate rectified voltages in response to the radio-frequency test signals. The test measurement circuitry may sense the rectified voltages (e.g., as DC voltages). The test measurement circuitry and/or the test host may convert the sensed DC voltages into electric field magnitude values. These operations may be performed concurrently for each dipole element 72 in planar test probe 68P. Phased antenna array 54 may scan over all possible beam steering angles while transmitting radio-frequency test signals 95. In this way, planar test probe 68P may be used to measure electric field magnitude values for the transmitted radio-frequency test signals and thus radiation pattern envelope 92 at multiple locations in the X-Y plane of FIG. 8.

If desired, test equipment 58 may also be used to calculate the phase of radio-frequency test signals 95. In order to calculate the phase of the transmitted radio-frequency test signals, planar test probe 68P may gather electric field magnitude values at multiple distances with respect to phased antenna array 54. For example, after planar test probe 68P has been used to gather electric field magnitude values at distance 94 from CUT 60, planar test probe 68P may be moved to distance 98 from CUT 60, as shown by arrow 100. Planar test probe 68P may then be used to gather electric field magnitude values at distance 98 from CUT 60. The test measurement circuitry and/or the test host may use the known distances 94 and 98 and the gathered electric field magnitude values at distances 94 and 98 to determine the phase of the radio-frequency test signals transmitted by CUT 60.

The test host may use the electric field magnitude values gathered at distance 94, the electric field magnitude values gathered at distance 98, the DC voltages measured at distance 94, the DC voltages measured at distance 98, and/or the calculated phases of radio-frequency test signals 95 to determine whether CUT 60 exhibits satisfactory radio-frequency performance. These values may be used to determine whether radiation pattern envelope 92 (or the radiation pattern of phased antenna array 54 at one or more beam steering angles) matches a predetermined satisfactory radiation pattern (e.g., a predetermined satisfactory radiation pattern envelope). For example, if the measured radiation pattern envelope exhibits undesirable gain nulls or an excessively non-uniform shape, CUT 60 may be marked as failing the radio-frequency test operation (e.g., while processing step 90 of FIG. 6). The example of FIG. 8 is merely illustrative. If desired, electric field strength may be measured at more than two distances from CUT 60.

Figure 9:
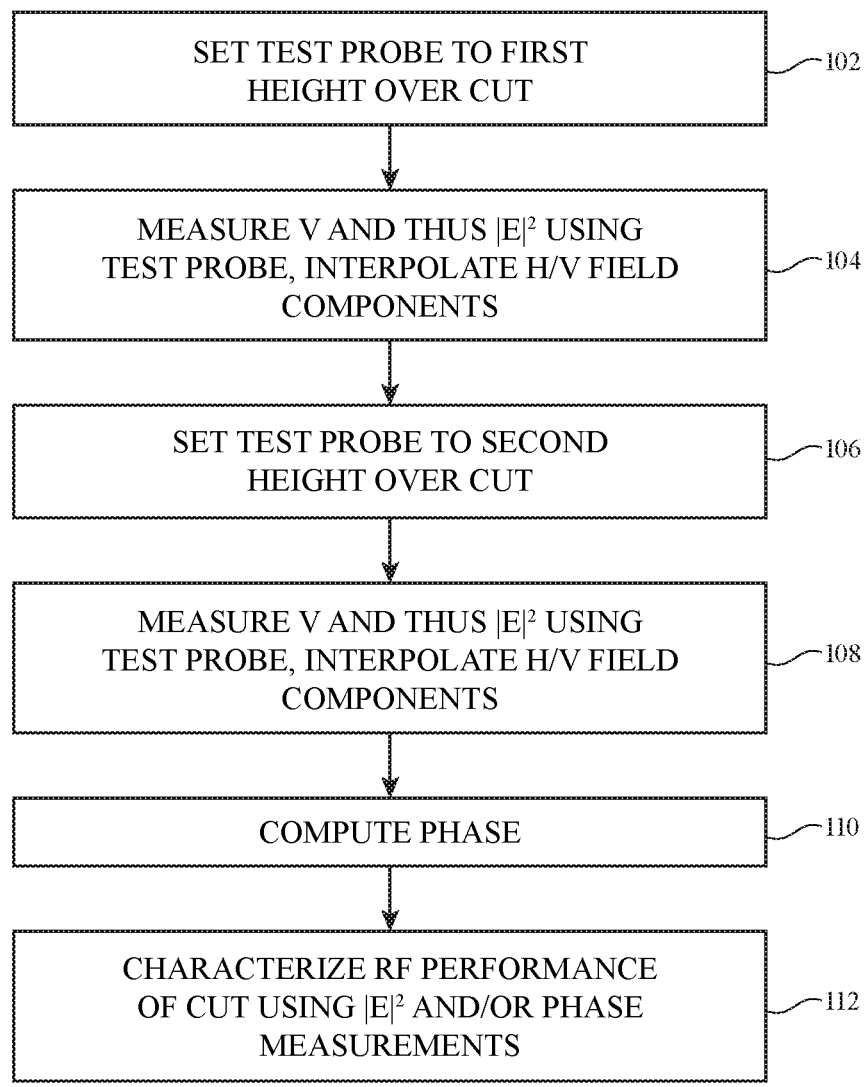
FIG. 9 is a flow chart of illustrative steps involved with performing radio-frequency test operations on wireless circuitry under test using a planar test probe in accordance with some embodiments.

FIG. 9 is a flow chart of illustrative steps associated with performing radio-frequency test operations on CUT 60 using planar test probe 68P. The steps of FIG. 9 may, for example, be performed while processing steps 88 and 90 of FIG. 6.

At step 102 of FIG. 9, planar test probe 68P may be set a first height over CUT 60. For example, planar test probe 68P may be located at distance 94 from CUT 60 (FIG. 8).

At step 104, planar test probe 68P may measure the DC voltage V and electric field magnitude $|E|^2$ of the radio-frequency test signals at the location of each dipole element, where "E" is the electric field vector of the transmitted radio-frequency test signals. As an example, dipole elements 72H of planar test probe 68P (FIG. 5) may measure the magnitude of the electric field component parallel to the X-axis of FIGS. 7 and 8. Similarly, dipole elements 72V of planar test probe 68P may measure the magnitude of the electric field component parallel to the Y-axis. The test measurement circuitry and/or the test host may perform interpolation operations on these measurements to determine (e.g., estimate) the magnitude of the electric field component parallel to the Y-axis at the locations of dipole elements 72H and the magnitude of the electric field component parallel to the X-axis at the locations of dipole elements 72V. In this way, the test host may have information about the electric field at the location of each dipole element in the planar test probe regardless of the polarization of the radio-frequency test signals and may use this information to determine the radiation pattern for CUT 60.

At step 106, planar test probe 68P may be set to a second height over CUT 60. For example, planar test probe 68P may be located to distance 98 from CUT 60 (FIG. 8).

At step 108, planar test probe 68P may measure the DC voltage V and electric field magnitude $|E|^2$ of the radio-frequency test signals at the location of each dipole element. The test measurement circuitry and/or the test host may perform interpolation operations on these measurements to determine (e.g., estimate) the magnitude of the electric field component parallel to both the Y-axis and the X-axis across the lateral area of the planar test probe. In this way, the test host may have information about the electric field at the location of each dipole element in the planar test probe regardless of polarization of the radio-frequency test signals and may use this information to determine the radiation pattern for CUT 60.

At step 108, the test measurement circuitry and/or the test host may compute the phase of the radio-frequency test signals by comparing the measurements obtained while processing step 104 to the measurements obtained while processing step 108.

At step 112, the test host may characterize the radio-frequency performance of CUT 60 using the measurements obtained while processing steps 104 and 108 and/or using the phase computed while processing step 110. For example, the test host may use these measurements, which are indicative of the radiation pattern of CUT 60, to a predetermined satisfactory radiation pattern (e.g., a predetermined satisfactory radiation pattern envelope). If the measured radiation pattern of CUT 60 matches the predetermined satisfactory radiation pattern, CUT 60 may be labeled as passing testing. If the measured radiation pattern of CUT 60 deviates excessively from the predetermined satisfactory radiation pattern, CUT 60 may be labeled as failing testing, may be scrapped, may be reworked, may be redesigned, etc.

The example of FIG. 9 is merely illustrative. If desired, steps 106-110 may be omitted. Similar operations may be used in scenarios where the test probe includes only one or two dipole elements rather than an M-by-N array of dipole elements formed on a planar test probe (e.g., wherein M and N are each greater than or equal to two). In one suitable arrangement, the test probe may be formed from one or more substrates that are oriented vertically with respect to CUT 60. Test probes of this type may sometimes be referred to herein as vertical test probes 68V.

Figure 10:
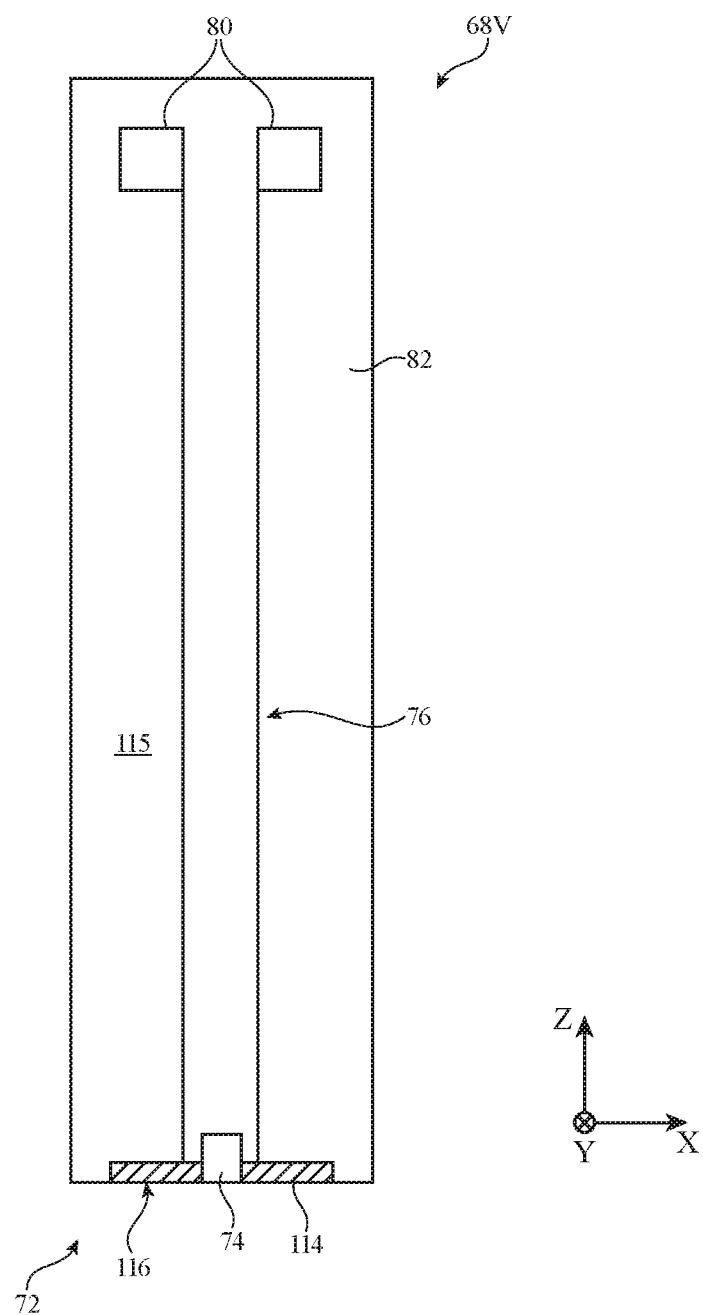
FIG. 10 is a side view of an illustrative vertical test probe having a dipole element for measuring the radiation pattern of wireless circuitry under test in accordance with some embodiments.

FIG. 10 is a side view of an illustrative vertical test probe 68V. As shown in FIG. 10, vertical test probe 68V may include contact pads 80 and transmission line 76 on lateral surface 115 of dielectric substrate 82. Dipole element 72 may be formed from conductive traces 114 at the intersection of bottom surface (side) 116 and lateral surface 115 of dielectric substrate 82 (e.g., conductive traces 114 may be formed on lateral surface 115 at the edge of lateral surface defined by bottom surface 116, may be formed on bottom surface 116 itself, or may be formed on both bottom surface 116 and lateral surface 115). Bottom surface 116 is perpendicular to lateral surface 115 in this example. Diode 74 may be mounted to lateral surface 115 or bottom surface 116. During radio-frequency test operations, vertical test probe 68V may be held over circuitry under test with bottom surface 116 facing the circuitry under test.

In the example of FIG. 10, vertical test probe 68V only measures a single component of the received radio-frequency test signals (e.g., vertical test probe 68V of FIG. 10 measures the magnitude of the electric field component parallel to the X-axis of FIG. 10). If desired, vertical test probe 68V may include multiple perpendicular dipole elements 72 for concurrently measuring different orthogonal electric field components of the received radio-frequency test signals.

Figure 11:
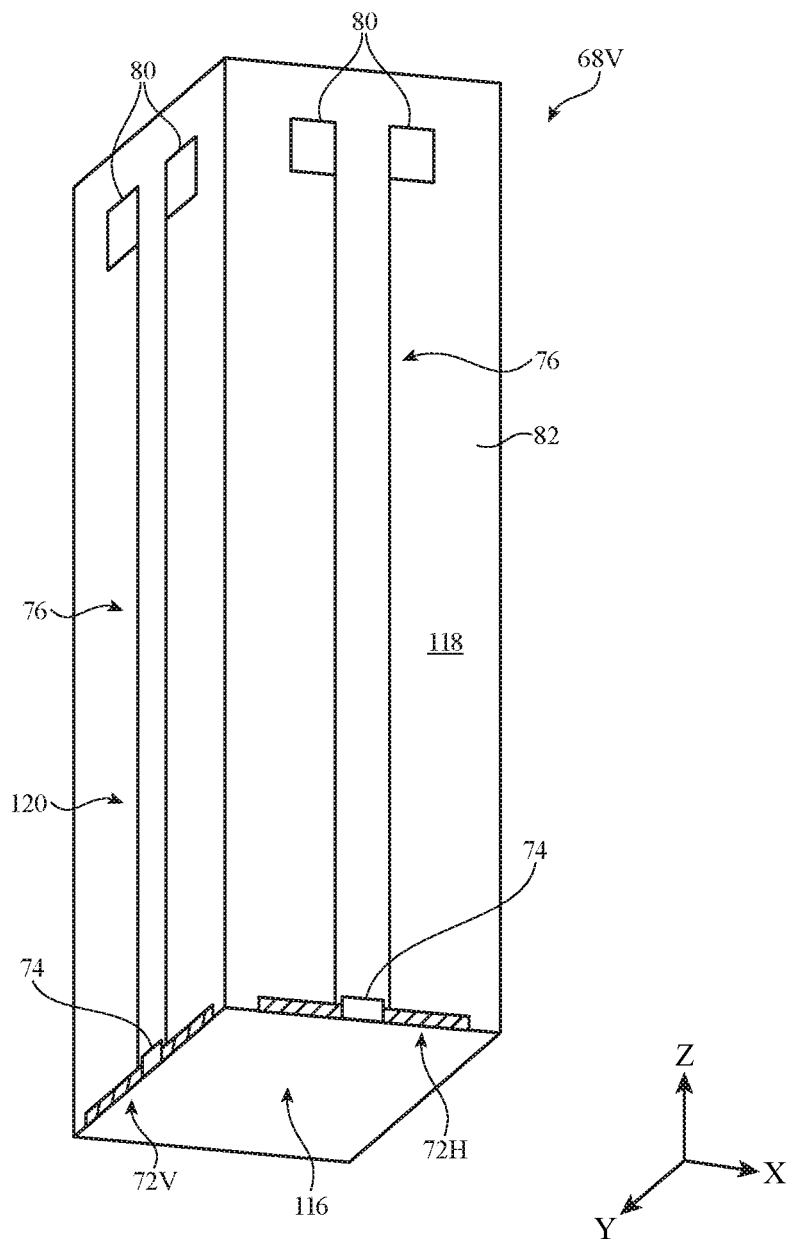
FIG. 11 is a perspective view of an illustrative vertical test probe having multiple dipole elements for measuring orthogonal electric field components of the radiation pattern of wireless circuitry under test in accordance with some embodiments.

FIG. 11 is a bottom perspective view of an illustrative vertical test probe 68V having multiple dipole elements for concurrently measuring different orthogonal electric field components. As shown in FIG. 11, vertical test probe 68V may include a first pair of contacts pads 80 and a first transmission line 76 on lateral surface 120 of dielectric substrate 82. Vertical test probe 68V may also include a second pair of contact pads 80 and a second transmission line 76 on lateral surface 118 of dielectric substrate 82. Lateral surface 118 may be perpendicular to lateral surface 120. Vertical test probe 68V may include a first dipole element 72V formed from conductive traces at the intersection of lateral surface 120 and bottom surface 116. Vertical test probe 68V may also include a second dipole element 72H formed from conductive traces at the intersection of lateral surface 118 and bottom surface 116. Dipole elements 72H and 72V may measure orthogonal electric field components of the radio-frequency test signals. The examples of FIGS. 10 and 11 are merely illustrative. If desired, dielectric substrate 82 may have other shapes.

Figure 12:
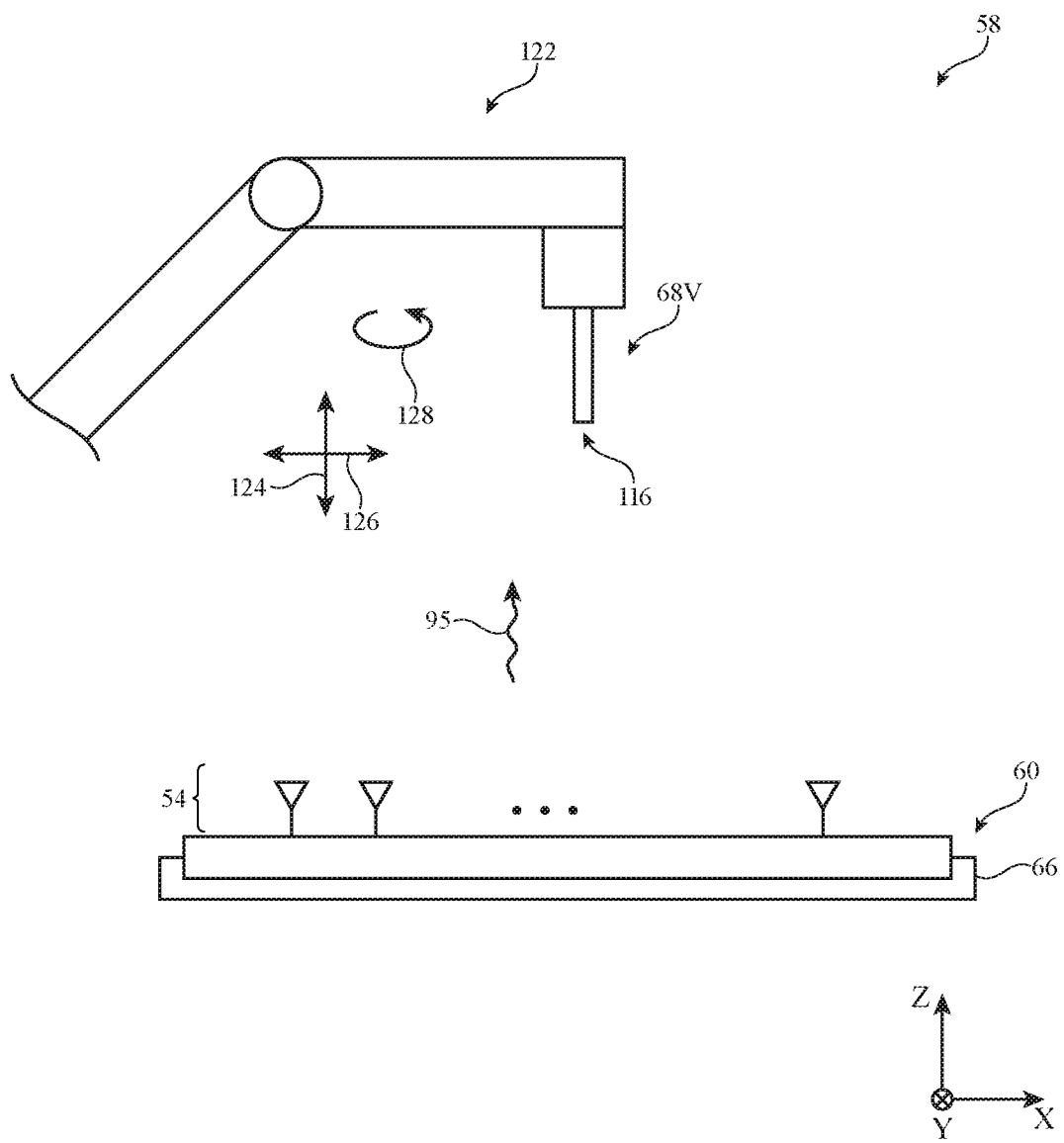
FIG. 12 is a side view of illustrative wireless equipment for measuring the radiation pattern of wireless circuitry under test using a vertical test probe of the types shown in FIGS. 10 and 11 in accordance with some embodiments.

A single vertical test probe 68V may be used to measure the radio-frequency test signals at different locations above CUT 60 or multiple vertical test probes 68V may be used to concurrently measure the radio-frequency test signals at different locations above CUT 60. FIG. 12 is a side view showing how a single vertical test probe 68V may be used to measure the radio-frequency test signals at different locations above CUT 60.

As shown in FIG. 12, test equipment 58 may include a mechanical positioner such as mechanical positioner 122. Vertical test probe 68V may be mounted to mechanical positioner 122. Mechanical positioner 122 may hold vertical test probe 68V in place over CUT 60 with bottom surface 116 of vertical test probe 68V facing CUT 60. Mechanical positioner 122 may include a translational positioner, a rotational positioner, a telescoping positioner, a robotic arm, and/or any other desired equipment for adjusting the position of vertical test probe 68V relative to CUT 60.

Mechanical positioner 122 may adjust the separation between CUT 60 and vertical test probe 68V as shown by arrow 124 (e.g., to measure the phase of radio-frequency test signals 95), may adjust the lateral position of vertical test probe 68V over CUT 60 as shown by arrow 126, and/or may rotate vertical test probe 68V about its longitudinal axis, as shown by arrow 128. Vertical test probe 68V may include a single dipole element as shown in FIG. 10 or may include multiple orthogonal dipole elements as shown in FIG. 11. In scenarios where vertical test probe 68V includes a single dipole element, mechanical positioner 122 may rotate vertical test probe 68V (e.g., as shown by arrow 128) to measure different electric field components of the radio-frequency test signals 95 transmitted by CUT 60. Mechanical positioner 122 may adjust the position of vertical test probe 68V to measure the electric field strength and/or calculate the phase of the radio-frequency test signals transmitted by CUT 60 at different locations (e.g., to measure the radiation pattern and/or radiation pattern envelope of CUT 60).

Figure 13:
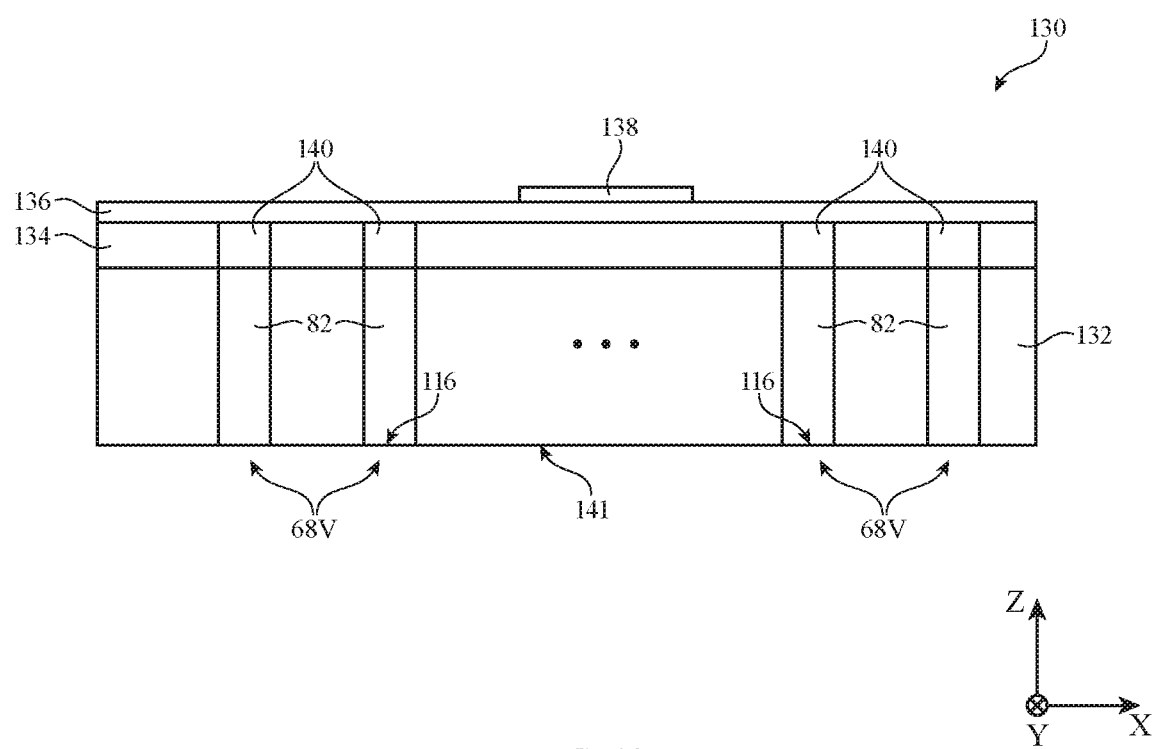
FIG. 13 is a cross-sectional side view of an illustrative vertical test probe array that may be used to measure the radiation pattern of wireless circuitry under test in accordance with some embodiments.

In another suitable arrangement, multiple vertical test probes 68V may be held over CUT 60 for concurrently measuring the radio-frequency test signals at multiple positions. In one suitable arrangement, the vertical test probes may be arranged in a vertical test probe array. FIG. 13 is a cross-sectional side view of an illustrative vertical test probe array.

As shown in FIG. 13, vertical test probe array 130 may include multiple vertical test probes 68V (e.g., vertical test probes having a single dipole element as shown in FIG. 10 and/or vertical test probes having orthogonal dipole elements as shown in FIG. 11). Vertical test probes 68V may be arranged in a grid pattern having rows and columns or in any other desired pattern in vertical test probe array 130. Vertical test probes 68V (e.g., dielectric substrates 82) may be embedded within insulator member 132. Insulator member 132 may separate each vertical test probe 68V from the other vertical test probes in vertical test probe array 130 and may help to hold vertical test probes 68V in place. Insulator member 132 may include plastic, foam, ceramic, or any other desired dielectric materials.

Insulator member 132 and vertical test probes 68V may be mounted to a substrate such as printed circuit board 136. Printed circuit board 136 may include conductive traces coupled to the contact pads on each vertical test probe 68V (e.g., contact pads 80 as shown in FIGS. 10 and 11) via a corresponding connector 140. The conductive traces on printed circuit board 136 may couple connectors 140 to printed circuit board connector 138. Printed circuit board connector 138 may be coupled to test measurement circuitry 70 and/or test host 62 (FIG. 4). If desired, an absorber layer 134 may be formed over insulator member 132. Absorber layer 134 may help to mitigate radio-frequency interference from energy reflected off of printed circuit board 136 back towards vertical test probes 68V.

During radio-frequency test operations, vertical test probe array 130 may be held over the circuitry under test with bottom surface 141 facing the circuitry under test. Bottom surface 116 of vertical test probes 68V may lie flush with bottom surface 141 of vertical test probe array 130, for example. Vertical test probe array 130 may sample the electric field magnitude of the radio-frequency test signals transmitted by the circuitry under test (e.g., vertical test probe array 130 may replace planar test probe 68P of FIG. 8 and may be used to perform radio-frequency testing using the steps of FIG. 9).

Figure 14:
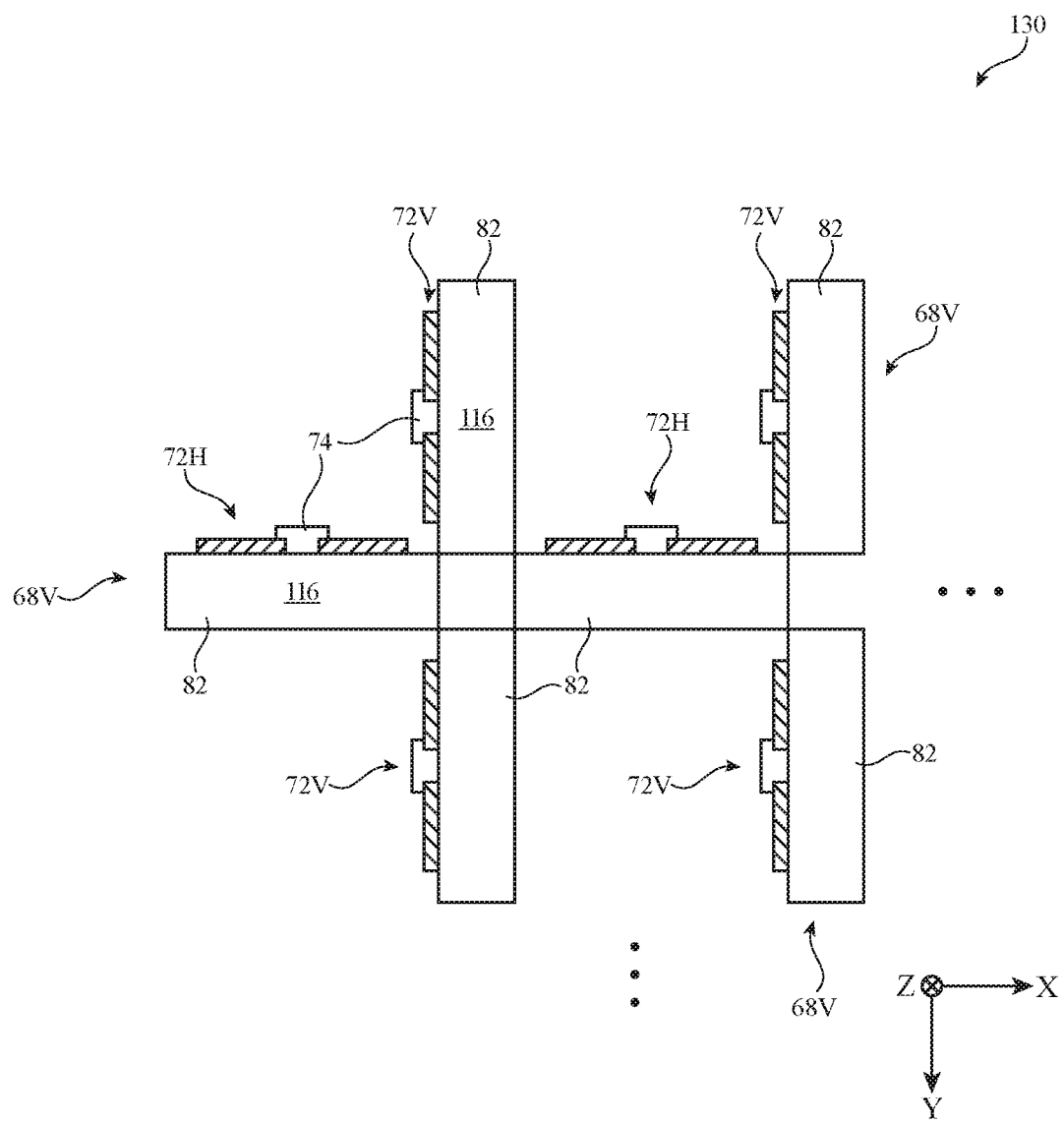
FIG. 14 is a bottom-up view of an illustrative vertical test probe array that may be used to measure orthogonal electric field components of the radiation pattern of wireless circuitry under test in accordance with some embodiments.

In scenarios where vertical test probe array 130 includes vertical test probes with a single dipole element (e.g., as shown in FIG. 10), the vertical test probes may be arranged in a pattern that allows vertical test probe array 130 to sample orthogonal electric field components of the transmitted radio-frequency test signals, as shown in the bottom-up view of FIG. 14. Insulator member 132 and printed circuit board 136 of FIG. 13 have been omitted from FIG. 14 for the sake of clarity. Insulator member 132 may be omitted from vertical test probe array 130 if desired.

As shown in FIG. 14, vertical test probe array 130 may include vertical test probes 68V having dipole elements 72V oriented parallel to the Y-axis and may include vertical test probes 68V having dipole elements 72H oriented parallel to the X axis. Bottom surface 116 of vertical test probes 68V may face the circuitry under test. The vertical test probes 68V having dipole elements 72V and the vertical test probes 68V having dipole elements 72H may be arranged in an interleaved grid pattern (e.g., a rectangular grid pattern having alternating rows of dipole elements 72H and 72V). The test host and/or test measurement circuitry may interpolate the magnitude of the electric field component parallel to the Y-axis for the X-Y locations of dipole elements 72H using the electric field magnitude values gathered using dipole elements 72V. Similarly, the test host and/or test measurement circuitry may interpolate the magnitude of the electric field component parallel to the X-axis for the X-Y locations of dipole elements 72V using the electric field magnitude values measured using dipole elements 72H. In this way, the test host may characterize the radiation pattern for the circuitry under test regardless of the polarization of the radio-frequency test signals across the lateral area of vertical test probe array 130.

If care is not taken, in scenarios where planar test probe 68P of FIGS. 7 and 8 is used to perform radio-frequency testing, the radio-frequency signals transmitted by the circuitry under test may reflect off of different portions of the test equipment to produce undesirable signal interference at the dipole elements. This undesirable interference may produce errors in the rectified voltages and electric field magnitude values gathered by each of the dipole elements. In one suitable arrangement, the planar probe array may include additional layers of dielectric material that are configured to mitigate undesirable interference at the dipole elements.

Figure 15:
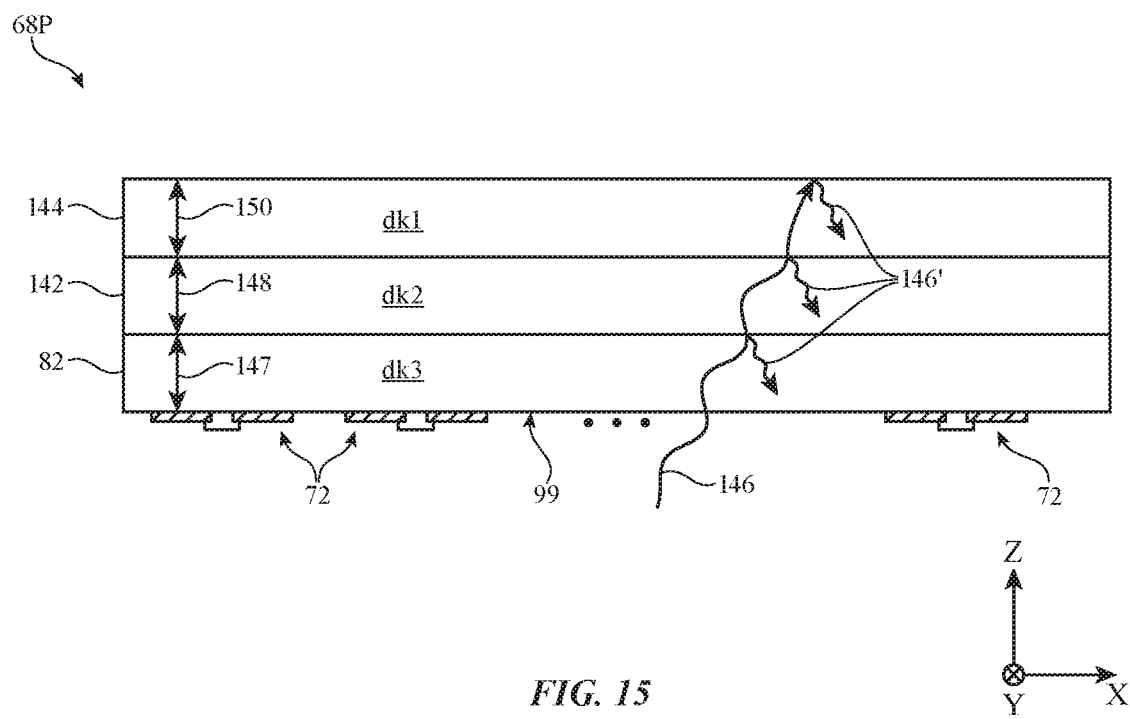
FIG. 15 is a side view of an illustrative planar test probe having an array of dipole elements and multiple layers of dielectric material for mitigating the effects of reflected radio-frequency signals at the dipole elements in accordance with some embodiments.

FIG. 15 is a side view showing how planar test probe 68P may be provided with additional layers of dielectric material that are configured to mitigate interference at dipole elements 72. As shown in FIG. 15, planar test probe 68P may include dipole elements 72 mounted to bottom surface 99 of dielectric substrate 82. During radio-frequency testing, bottom surface 99 may face the circuitry under test.

The circuitry under test may transmit radio-frequency test signals 146 towards planar test probe 68P. Due to discontinuities in dielectric permittivity, radio-frequency test signals 146 may reflect off of the interfaces (surfaces) of dielectric substrate 82 and towards dipole elements 72, as shown by arrows 146'. If care is not taken, this reflected energy may undesirably interfere with the measurements performed using dipole elements 72.

As shown in FIG. 15, additional dielectric layers such as dielectric layers 142 and 144 may be layered over dielectric substrate 82. Dielectric substrate 82, dielectric layer 142, and dielectric layer 144 may be configured to minimize the amount of reflected radio-frequency energy at dipole elements 72. For example, dielectric layer 144 may be formed from a material having dielectric constant $d_{k1}$ and may have thickness 150. Dielectric layer 142 may be formed from a material having dielectric constant $d_{k2}$ and may have thickness 148. Dielectric substrate 82 may be formed from a material having dielectric constant $d_{k3}$ and may have thickness 147. Dielectric constant $d_{k1}$, dielectric constant $d_{k2}$, dielectric constant $d_{k3}$, thickness 150, thickness 148, and/or thickness 147 may be selected to minimize the presence of reflected radio-frequency energy at dipole elements 72.

For example, these values may be selected so that the radio-frequency signals reflected off of the boundary between dielectric layer 142 and dielectric substrate 82 and/or the radio-frequency signals reflected off of the boundary between dielectric layer 144 and free space destructively interfere with the radio-frequency signals reflected off of the boundary between substrate 82 and dielectric layer 142. Thicknesses 150 and 148 may, for example, be selected to be approximately one-eight or one-quarter of the effective wavelength of radio-frequency test signals 146. The effective wavelength may be equal to the free space wavelength multiplied by a constant based on the dielectric constant through which the signals propagate (e.g., dielectric constant $d_{k1}$, $d_{k2}$, etc.). This may serve to minimize the magnitude of reflected radio-frequency signals at the location of dipole elements 72, thereby mitigating interference with the measurements gathered using dipole elements 72. The example of FIG. 15 is merely illustrative. If desired, more than two dielectric layers may be layered over dielectric substrate 82 or only one of dielectric layers 144 and 142 may be used.

Figure 16:
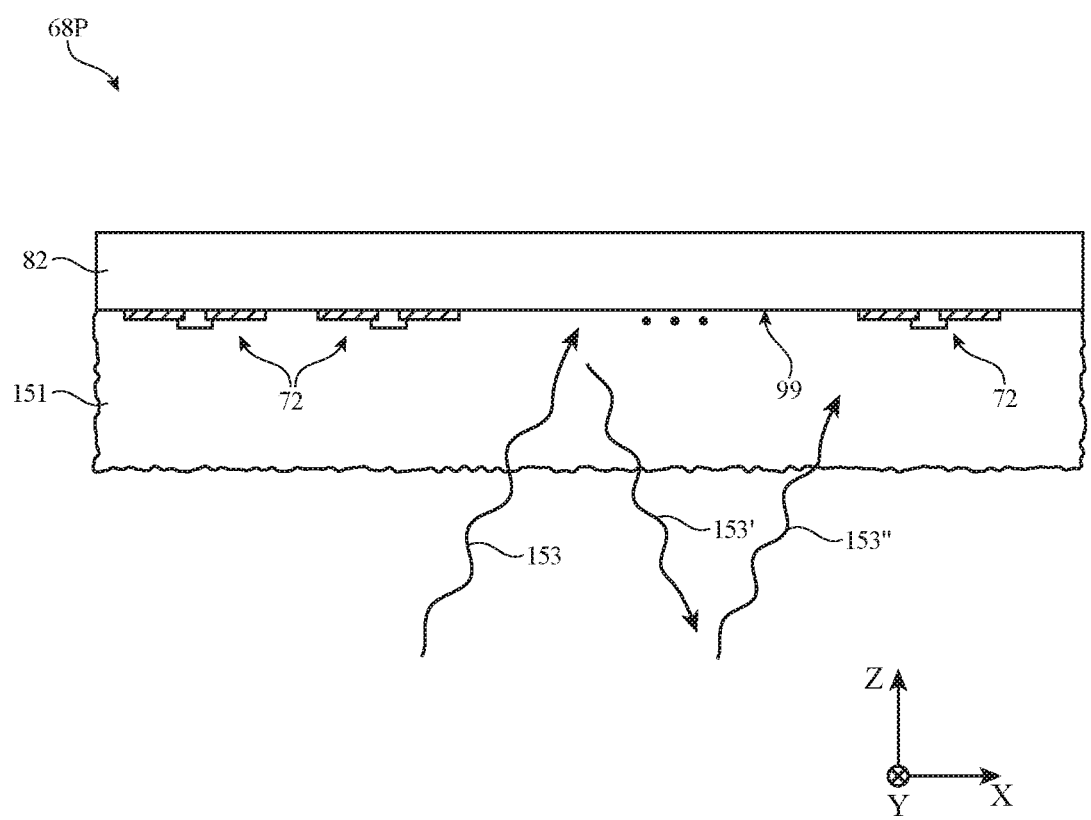
FIG. 16 is a side view of an illustrative planar test probe having an absorber layer under an array of dipole elements for mitigating the effect of reflected radio-frequency signals at the dipole elements in accordance with some embodiments.

In practice, the radio-frequency test signals may also reflect off of the circuitry under test back towards dipole elements 72. If care is not taken, this reflected energy may also undesirably interfere with measurements gathered using the dipole elements. As shown in FIG. 16, planar test probe 68P may be provided with an absorber layer 151 mounted to bottom surface 99 of dielectric substrate 82 under dipole elements 72. Absorber layer 151 may be formed using foam or other dielectric materials.

During radio-frequency test operations, the circuitry under test may transmit radio-frequency test signals 153. Radio-frequency test signals 153 may reflect off of bottom surface 99 of dielectric substrate 82, as shown by reflected signals 153'. Reflected signals 153' may reflect off of the circuitry under test back towards dipole elements 72, as shown by reflected signals 153". Absorber layer 151 may absorb and attenuate reflected signals 153' and 153" to minimize the effect of reflected signals 153" on the measurements gathered using dipole elements 72.

The example of FIG. 16 is merely illustrative. If desired, more than one absorber layer may be used. Planar test probe 68P may be provided with additional dielectric layers 142 and 144 of FIG. 15 and absorber layer 151 if desired. Additional dielectric layers 142 and 144 of FIG. 15 may be provided over vertical test probe array 130 of FIGS. 13 and 14 and/or absorber layer 151 of FIG. 16 may be provided under vertical test probe array 130 of FIGS. 13 and 14 if desired.

Figure 17:
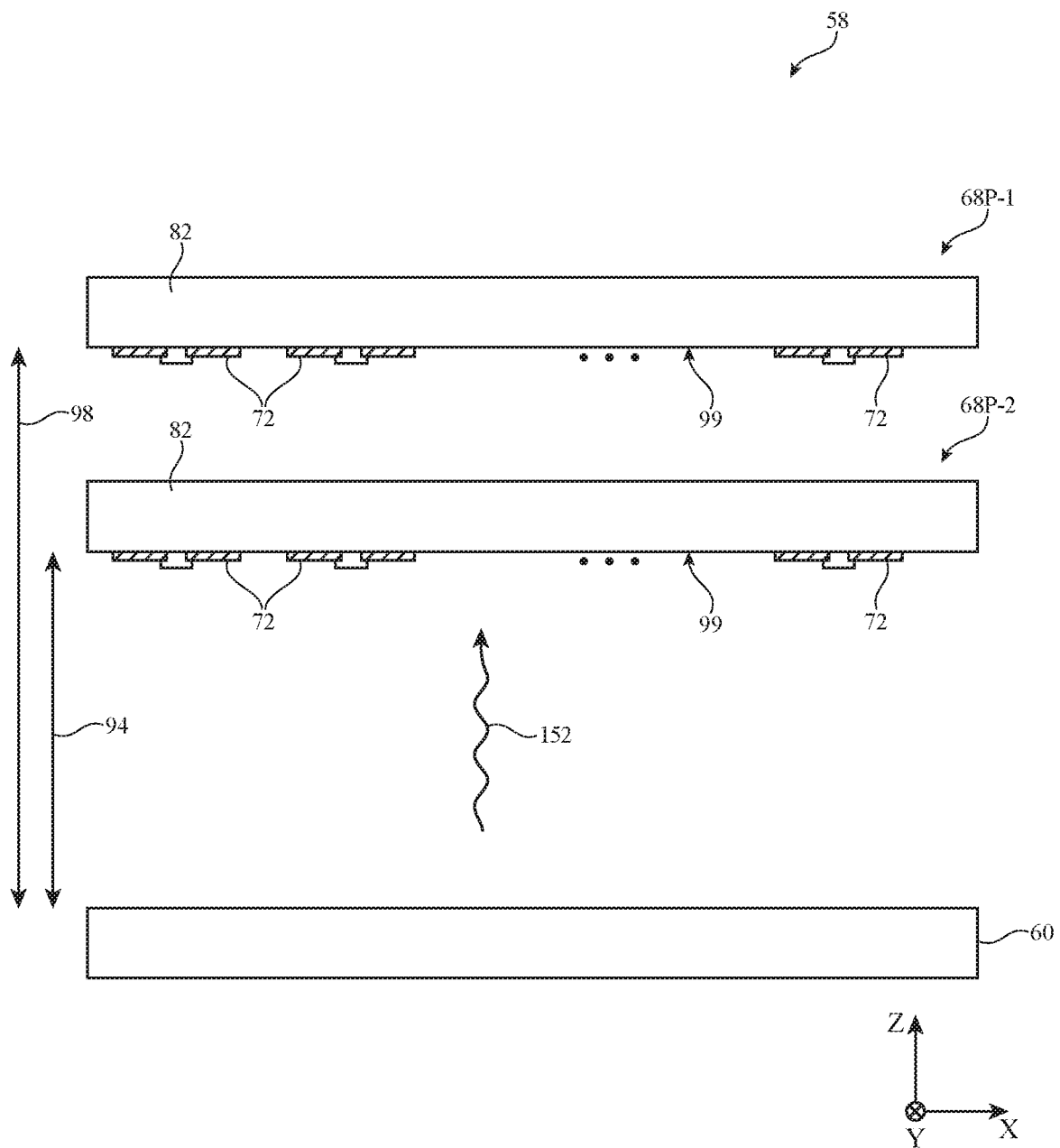
FIG. 17 is a side view showing how multiple planar test probes may be used to concurrently measure the radiation pattern of wireless circuitry under test in accordance with some embodiments.

If desired, multiple planar test probes 68P may be used to concurrently measure the radio-frequency test signals transmitted by the circuitry under test at different distances with respect to the circuitry under test. FIG. 17 is a diagram showing how multiple planar test probes may be used to concurrently measure the radio-frequency test signals.

As shown in FIG. 17, test equipment 58 may include a first planar test probe 68P-1 located at distance 98 from CUT 60 and a second planar test probe 68P-2 located at distance 94 from CUT 60. CUT 60 may transmit radio-frequency test signals 152. Planar test probes 68P-1 and 68P-2 may concurrently gather DC voltage and/or electric field magnitude values for radio-frequency test signals 152. The test measurement circuitry and/or test host may gather phase information for the radio-frequency test signals using the gathered electric field magnitudes and the known distance between planar test probes 68P-1 and 68P-2. Performing radio-frequency test operations in this way may take less time than in scenarios where a single planar test probe is moved between distances 98 and 94 (as shown in FIG. 8). At the same time, the presence of planar test probe 68P-2 may at least partially attenuate radio-frequency test signals 152 before the test signals reach planar test probe 68P-1.

Figure 18:
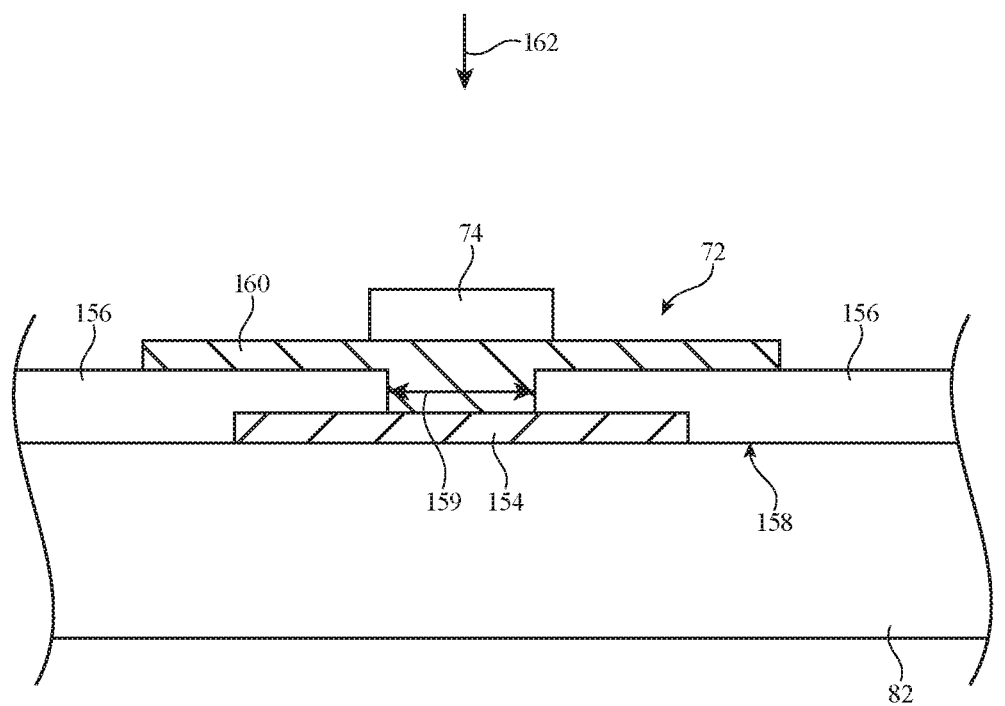
FIG. 18 is a cross-sectional side view showing how a dipole element for a test probe may be formed on an underlying substrate in accordance with some embodiments.

FIG. 18 is a cross-sectional side view showing how dipole element 72 may be formed on a surface of dielectric substrate 82. As shown in FIG. 18, dipole element 72 may be mounted to surface 158 of dielectric substrate 82. Surface 158 may be bottom surface 116 of vertical test probe 68V (FIGS. 10-14) or may be bottom surface 99 of planar test probe 68P (FIGS. 8, 15, and 16). Dipole element 72 may include conductive traces 154 patterned directly onto surface 158 of dielectric substrate 82. In one suitable arrangement, dielectric substrate 82 may be glass and conductive traces 154 may be indium tin oxide traces. An insulating layer such as overcoating 156 may be layered over conductive traces 154 and dielectric substrate 82. An opening such as opening 159 may be provided in overcoating 156. Conductive traces 160 may be patterned on overcoating 156 and may contact conductive traces 154 through opening 159. Conductive traces 160 may form the dipole arms of dipole element 72 (e.g., dipole arms 75-1 and 75-2 of FIG. 5). As an example, conductive traces 160 may be formed from metal such as copper or silver. The dipole arms may extend parallel to the Y-axis of FIG. 18. Diode 74 may be surface-mounted to conductive traces 160.

Figure 19:
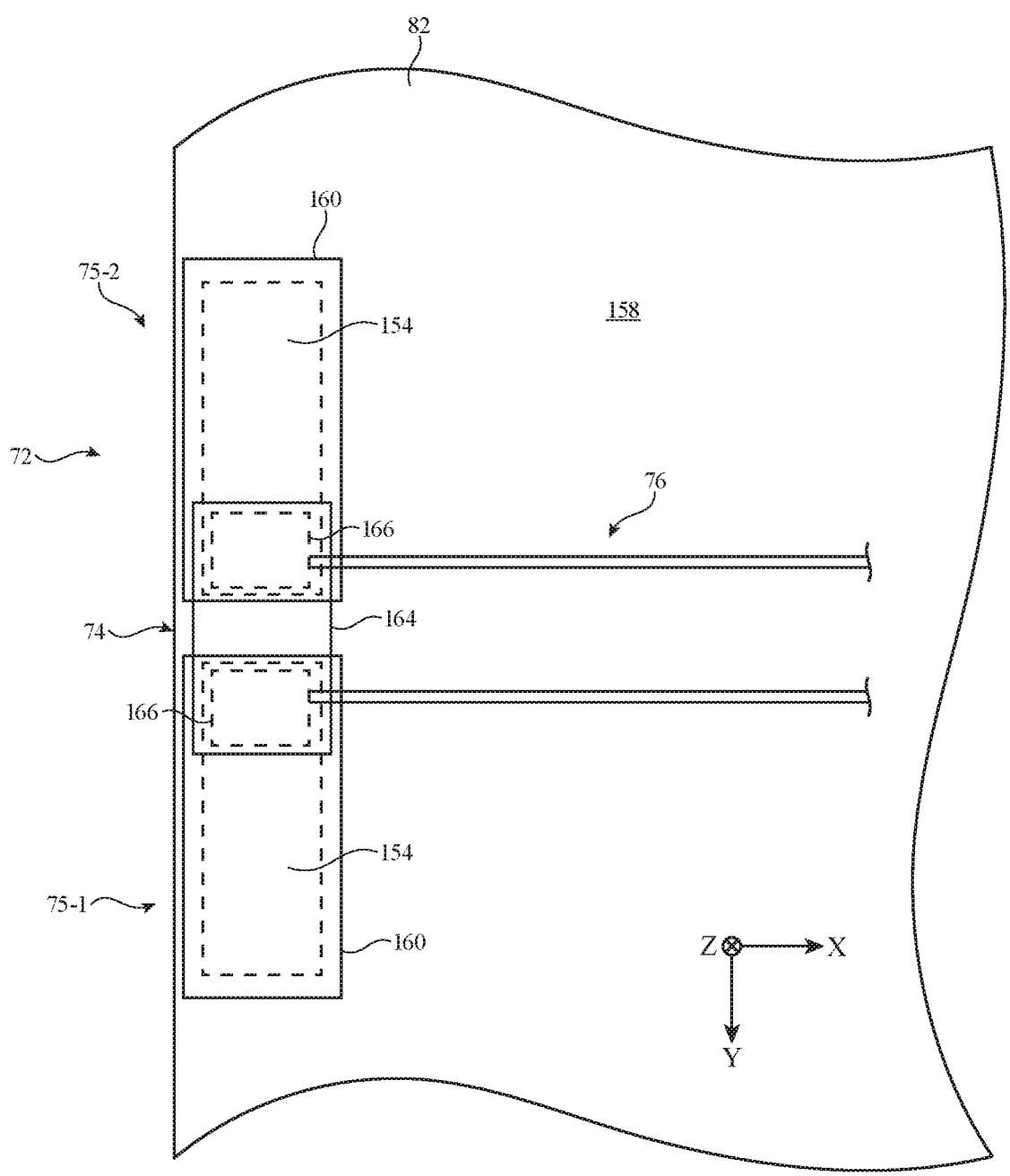
FIG. 19 is a top-down view showing how a dipole element for a test probe may be formed on an underlying substrate in accordance with some embodiments.

FIG. 19 is a top-down view showing how dipole element 72 may be mounted to surface 158 of dielectric substrate 82 (e.g., as taken in the direction of arrow 162 of FIG. 18). Overcoating 156 has been omitted from FIG. 19 for the sake of clarity. As shown in FIG. 19, conductive traces 154 may be patterned onto surface 158 of the underlying dielectric substrate 82. Transmission line 76 may be patterned onto surface 158 and may be coupled to conductive traces 154 (e.g., conductive traces 154 and transmission line 76 may both be formed from the same layer of indium tin oxide on surface 158). Conductive traces 160 may be patterned over the underlying conductive traces 154 and may be electrically coupled to conductive traces 154 (e.g., through opening 159 of FIG. 18). Conductive traces 160 may form dipole arms 75-1 and 75-2 of dipole element 72. Diode 74 may be mounted over the underlying conductive traces 154. Diode 74 may include a diode body 164 that is coupled to the underlying conductive traces 160 by diode contacts 166. Diode contacts 166 may serve to couple diode 74 between dipole arms 75-1 and 75-2. The example of FIGS. 18 and 19 is merely illustrative and, if desired, other layouts may be used to form dipole elements 72 on dielectric substrate 82.

The foregoing is merely illustrative and various modifications can be made by those skilled in the art without departing from the scope and spirit of the described embodiments. The foregoing embodiments may be implemented individually or in any combination.

What is claimed is:

1. Apparatus comprising:
   a dielectric substrate;
   contact pads on the dielectric substrate;
   a transmission line on the dielectric substrate and coupled to the contact pads;
   a dipole element on the dielectric substrate and having first and second arms and coupled to the transmission line;
   a diode coupled between the first and second arms of the dipole element, wherein the diode is configured to generate a rectified voltage based on a current on the dipole element, the current having a frequency greater than 10 GHz, and the transmission line is configured to filter the rectified voltage to produce a direct current (DC) voltage; and
   circuitry coupled to the contact pads, and configured to compute a first electric field magnitude value based on the rectified voltage and to interpolate a second electric field magnitude value based on an additional rectified voltage gathered by the circuitry, the first electric field magnitude value being associated with a first component of an electric field that produced the current, and the second electric field magnitude value being associated with a second component of the electric field that is orthogonal to the first component.

2. The apparatus defined in claim 1, wherein the dielectric substrate comprises glass.

3. The apparatus defined in claim 2, wherein the first and second arms of the dipole element comprise indium tin oxide traces patterned on the glass and metal on the indium tin oxide traces.

4. The apparatus defined in claim 1, wherein the transmission line comprises indium tin oxide traces and is configured to form a low pass filter that generates the DC voltage based on the rectified voltage.

5. The apparatus defined in claim 4, wherein the transmission line comprises a first conductive line coupled to the first arm of the dipole element and a second conductive line coupled to the second arm of the dipole element, the first conductive line is separated from the second conductive line by less than 50 microns, and the transmission line has a length greater than five centimeters.

6. The apparatus defined in claim 1, wherein the circuitry comprises:
   test measurement circuitry coupled to the contact pads, the test measurement circuitry being configured to sense the DC voltage and having circuitry selected from the group consisting of: an analog-to-digital converter and a voltmeter.

7. The apparatus defined in claim 1, further comprising:
additional contact pads on the dielectric substrate;
an additional transmission line on the dielectric substrate and coupled to the additional contact pads;
an additional dipole element having third and fourth arms coupled to the additional transmission line, wherein the third and fourth arms of the additional dipole element are perpendicular to the first and second arms of the dipole element; and
an additional diode coupled between the third and fourth arms of the additional dipole element.

8. The apparatus defined in claim 7, wherein the dipole element and the additional dipole element are part of an M-by-N array of dipole elements on a lateral surface of the dielectric substrate, M and N each being greater than or equal to two.

9. The apparatus defined in claim 7, wherein the dielectric substrate has a first surface and a second surface perpendicular to the first surface, the dipole element being formed on the first surface and the additional dipole element being formed on the second surface.

10. A radio-frequency test probe configured to receive radio-frequency signals transmitted by circuitry under test, the radio-frequency test probe comprising:
a dielectric substrate having a lateral surface;
an array of dipole elements on the lateral surface;
transmission lines on the lateral surface and coupled to the dipole elements in the array;
diodes coupled to the dipole elements in the array, wherein the diodes are configured to produce, on the transmission lines, rectified voltages corresponding to the received radio-frequency signals; and
circuitry coupled to the transmission lines, mounted to the dielectric substrate, configured to measure the rectified voltages generated by the diodes, and configured to compute corresponding electric field magnitude values using the measured rectified voltages.

11. The radio-frequency test probe defined in claim 10, wherein the array of dipole elements comprises a first set of dipole elements and a second set of dipole elements oriented perpendicular to the dipole elements in the first set, each dipole element in the first and second sets being coupled to a respective one of the diodes.

12. The radio-frequency test probe defined in claim 10 wherein the dielectric substrate comprises glass and the dipole elements comprise indium tin oxide patterned on the glass.

13. The radio-frequency test probe defined in claim 10, further comprising:
a dielectric layer on the dielectric substrate, wherein the dielectric substrate is interposed between the array of dipole elements and the dielectric layer, the dielectric layer having a thickness that configures the dielectric layer to mitigate reflected electromagnetic energy at the array of dipole elements.

14. The radio-frequency test probe defined in claim 10, further comprising:
an absorber layer on the lateral surface of the dielectric substrate, wherein the array of dipole elements is configured to receive the radio-frequency signals through the absorber layer.

15. Wireless test equipment configured to perform radio-frequency testing on circuitry under test, the wireless test equipment comprising:
a fixture configured to receive the circuitry under test;
a radio-frequency test probe comprising:
a dielectric substrate having a first surface and a second surface perpendicular to the first surface,
contact pads on the first surface,
a transmission line on the first surface and coupled to the contact pads,
a dipole element on the first surface and coupled to the transmission line, wherein the dipole element is located at an edge of the first surface defined by the second surface, and
a diode coupled to the dipole element;
a mechanical positioner configured to hold the radio-frequency test probe at a fixed distance from the fixture while the second surface faces the fixture; and
measurement circuitry coupled to the contact pads and configured to measure a voltage across the contact pads.

16. The wireless test equipment defined in claim 15, wherein the dielectric substrate has a third surface perpendicular to the first and second surfaces and the radio-frequency test probe further comprises:
additional contact pads on the third surface;
an additional transmission line on the third surface and coupled to the additional contact pads;
an additional dipole element on the third surface and coupled to the additional transmission line, wherein the additional dipole element is located at an edge of the third surface that is defined by the second surface; and
an additional diode coupled to the additional dipole element, wherein the measurement circuitry is coupled to the additional contact pads and is configured to measure an additional voltage across the additional contact pads.

17. The wireless test equipment defined in claim 15, further comprising an array of radio-frequency test probes, wherein the array of radio-frequency test probes comprises:
a printed circuit board; and
an insulator member on the printed circuit board, wherein the radio-frequency test probe is embedded within the insulator member and the insulator member separates the radio-frequency test probe from at least one additional radio-frequency test probe in the array of radio-frequency test probes.

18. The wireless test equipment defined in claim 15, further comprising an additional radio-frequency test probe that comprises:
an additional dielectric substrate having a third surface and a fourth surface perpendicular to the third surface, wherein the third surface extends perpendicular to the first surface of the dielectric substrate, and the fourth surface is coplanar with the second surface of the dielectric substrate;
additional contact pads on the third surface;
an additional transmission line on the third surface and coupled to the additional contact pads;
an additional dipole element on the third surface and coupled to the additional transmission line, wherein the additional dipole element is located at an edge of the third surface defined by the fourth surface; and
an additional diode coupled to the additional dipole element.

* * * * *